US012751235B2

(12) United States Patent
Shibata

(10) Patent No.: US 12,751,235 B2
(45) Date of Patent: Sep. 29, 2026

(54) GAS SUPPLY SYSTEM, SUBSTRATE PROCESSING APPARATUS AND METHOD OF MANUFACTURING SEMICONDUCTOR DEVICE

(71) Applicant: Kokusai Electric Corporation, Tokyo (JP)

(72) Inventor: Tomonori Shibata, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 424 days.

(21) Appl. No.: 18/184,736

(22) Filed: Mar. 16, 2023

(65) Prior Publication Data

US 2023/0352320 A1 Nov. 2, 2023

(30) Foreign Application Priority Data

Apr. 28, 2022 (JP) ................................. 2022-074525
Feb. 2, 2023 (JP) ................................. 2023-014878

(51) Int. Cl.
*H10P 72/00* (2026.01)
*H10P 50/24* (2026.01)

(52) U.S. Cl.
CPC ........ *H10P 72/0421* (2026.01); *H10P 50/242* (2026.01)

(58) Field of Classification Search
CPC ........... H01L 21/67069; H01L 21/3065; H01L 21/6708; H01L 21/67115; H01L 21/67303; H01L 21/67017; H01L 21/67103; C23C 16/45546; C23C 16/45561; C23C 16/45512; C23C 16/455; C23C 16/44;
(Continued)

(56) References Cited

U.S. PATENT DOCUMENTS 6,283,143 B1 * 9/2001 Adachi, Jr. ........... F16K 49/002 137/341
10,215,317 B2 * 2/2019 Burkhart ............... B01F 35/883
(Continued)

FOREIGN PATENT DOCUMENTS

CN 101772590 A 7/2010
JP 2000-165030 A 6/2000
(Continued)

OTHER PUBLICATIONS

TIPO Office Action with English translation in Taiwan Application No. 112104233, dated Sep. 20, 2023, 11 pages.
(Continued)

*Primary Examiner* — Rudy Zervigon

(74) *Attorney, Agent, or Firm* — Edell, Shapiro & Finnan, LLC

(57) ABSTRACT

According to the present disclosure, there is provided a technique of a gas supply system including: a plurality of first valves capable of opening and closing one or more flow paths through which one or more fluids that contributes to a processing of a substrate are supplied to a process chamber; a plurality of heating regions in which the plurality of first valves are heated; a heat equalizing structure provided at the plurality of heating regions; and an adjustment structure provided between each adjacent pair among the plurality of heating regions so as to adjust a heat conduction in the heat equalizing structure.

17 Claims, 10 Drawing Sheets

(58) Field of Classification Search

CPC ....... C23C 16/50; C23C 16/22; C23C 16/509; C23C 16/54; C23C 14/56; C23C 16/04; C23C 16/06; C23C 16/24; C23C 16/34; C23C 16/458; C23C 16/48; C23C 16/505; C23C 16/513; C23C 16/52; C23C 16/56; H01J 37/3244; H01J 37/32449; F16K 27/00; F16K 11/10; F16K 11/00; F16K 11/20; F16K 31/06; F16K 1/00; F16K 1/36; F16K 1/42; F16K 11/04; F16K 15/02; F16K 15/06; F16K 15/14; F16K 17/06; F16K 3/00; F16K 3/26; F16K 31/145; F16K 31/36; F16K 49/00; F16K 51/02; F16K 7/00; F16K 7/12; F16K 7/14; B22F 3/00; B22F 3/105; B22F 7/04; B33Y 10/00; B33Y 80/00; F16L 13/00; F16L 23/14; F16L 25/00; F16L 3/00; F16L 41/02; F16L 43/00; F16L 47/14; F16L 51/02; F16L 9/00

USPC ........................ 118/715; 156/345.33, 345.34

See application file for complete search history.

(56) References Cited

U.S. PATENT DOCUMENTS

| | | | | |
|---|---|---|---|---|
| 10,794,519 | B2 * | 10/2020 | Burkhart | F16L 23/14 |
| 2010/0236480 | A1 | 9/2010 | Hara et al. | |
| 2017/0021317 | A1 * | 1/2017 | Shareef | B01F 35/7164 |
| 2017/0203511 | A1 * | 7/2017 | Burkhart | B22F 7/04 |
| 2018/0372130 | A1 | 12/2018 | Ochiishi et al. | |
| 2019/0106787 | A1 | 4/2019 | Ohno et al. | |
| 2019/0211955 | A1 * | 7/2019 | Burkhart | B29C 64/393 |
| 2020/0071821 | A1 | 3/2020 | Shirako et al. | |
| 2020/0199753 | A1 | 6/2020 | Hidaka et al. | |

FOREIGN PATENT DOCUMENTS

| | | | |
|---|---|---|---|
| JP | 2011-012723 | A | 1/2011 |
| JP | WO2017/130850 | A1 | 8/2017 |
| JP | WO2017/212546 | A1 | 12/2017 |
| JP | WO2019/021949 | A1 | 1/2019 |
| JP | 2020-38904 | A | 3/2020 |
| TW | 200932943 | A | 8/2009 |

OTHER PUBLICATIONS

Notice of Reasons for Refusal with English translation in Japanese Application No. 2023-014878, dated Apr. 1, 2024, 8 pages.

First Office Action with English translation in Chinese Application No. 202310251520.9, dated Apr. 4, 2026, 13 pages.

* cited by examiner

GAS SUPPLY SYSTEM, SUBSTRATE PROCESSING APPARATUS AND METHOD OF MANUFACTURING SEMICONDUCTOR DEVICE

CROSS REFERENCE TO RELATED APPLICATIONS

This non-provisional U.S. patent application is based on and claims priority under 35 U.S.C. § 119(a)-(d) to Japanese Patent Application No. 2022-074525 filed on Apr. 28, 2022 and Japanese Patent Application No. 2023-014878 filed on Feb. 2, 2023, in the Japanese Patent Office, the entire contents of which are hereby incorporated by reference.

TECHNICAL FIELD

The present disclosure relates to a gas supply system, a substrate processing apparatus and a method of manufacturing a semiconductor.

BACKGROUND

As an example of a substrate processing apparatus configured to process a substrate (hereinafter, also referred to as a "wafer") by supplying a process gas (or process gases) to the substrate under predetermined process conditions, a semiconductor manufacturing apparatus may be used. In recent years, according to some related arts, various process gases such as a source gas in a liquid state or a solid state at a room temperature (normal temperature) may be used in the semiconductor manufacturing apparatus. In such a case, in order to maintain the source gas in a gaseous state, not only a gas supply pipe through which the source gas is supplied but also a component such as a valve (or valves) provided in the gas supply pipe may be heated.

SUMMARY

According to the present disclosure, there is provided a technique capable of supplying a source gas into a process chamber without causing a phase change.

According to an aspect the technique of the present disclosure, there is provided a technique of a gas supply system including: a plurality of first valves capable of opening and closing one or more flow paths through which one or more fluids that contributes to a processing of a substrate are supplied to a process chamber; a plurality of heating regions in which the plurality of first valves are heated; a heat equalizing structure provided at the plurality of heating regions; and an adjustment structure provided between each adjacent pair among the plurality of heating regions so as to adjust a heat conduction in the heat equalizing structure.

DETAILED DESCRIPTION

Embodiments of Present Disclosure

Figure 1:
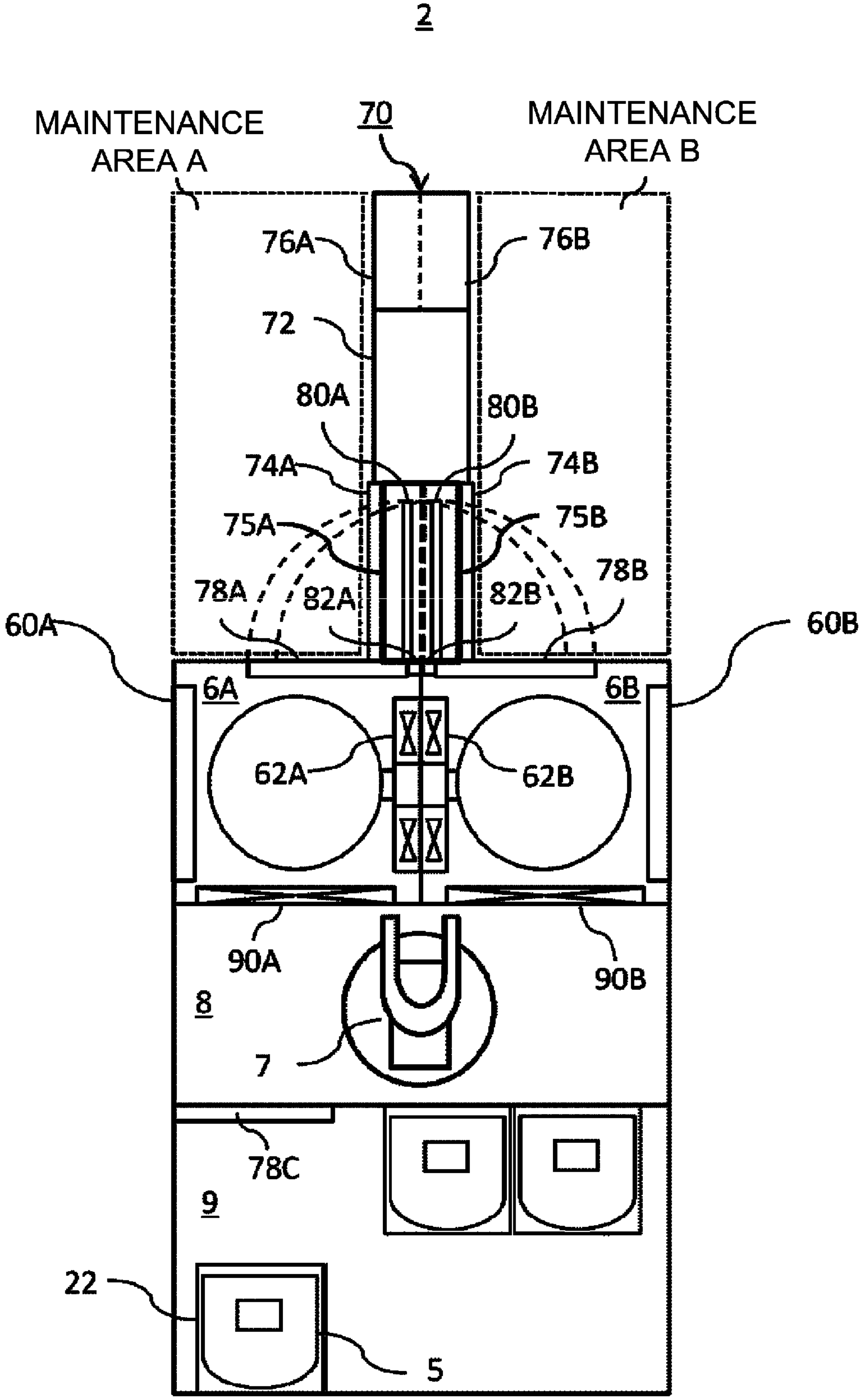
FIG. 1 is a diagram schematically illustrating an example of a substrate processing apparatus preferably used in one or more embodiments of the present disclosure when viewed from above.

Hereinafter, one or more embodiments (also simply referred to as "embodiments") of the technique of the present disclosure will be described in detail with reference to the drawings. The drawings used in the following descriptions are all schematic. For example, a relationship between dimensions of each component and a ratio of each component shown in the drawing may not always match the actual ones. Further, even between the drawings, the relationship between the dimensions of each component and the ratio of each component may not always match.

The same or corresponding reference numerals represent the same or corresponding components in the drawings, and redundant descriptions related thereto will be omitted. Further, in the drawings, a direction from a transport chamber 8 toward a storage chamber 9 described later may also be referred to as a "front direction", and a direction from the transport chamber 8 toward a transfer chamber 6A or a transfer chamber 6B (more specifically, a direction toward a maintenance area "A" or a maintenance area "B") described later may also be referred to as a "rear direction". In addition, a direction toward a boundary line (adjacent surface) between process modules 3A and 3B described later may also be referred to as an "inner direction", and a direction away from the boundary line between the process modules 3A and 3B may also be referred to as an "outer direction". Further, a substrate processing apparatus according to the present embodiments is configured as a vertical type substrate processing apparatus (hereinafter, also simply referred to as a "processing apparatus") 2 capable of performing a substrate processing such as a heat treatment process. The substrate processing is performed as a part of a manufacturing process in a method of manufacturing a semiconductor device.

Figure 2:
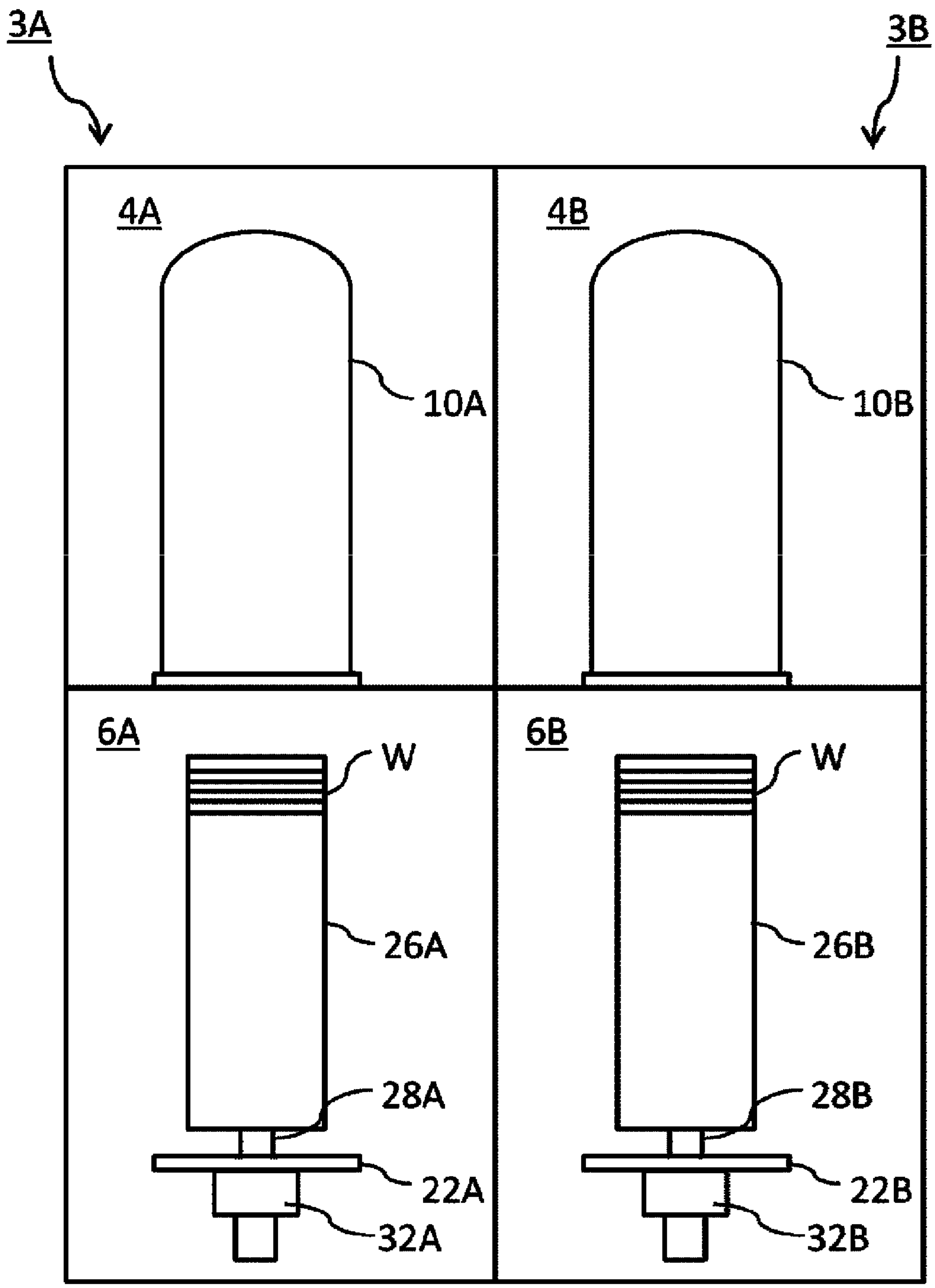
FIG. 2 is a diagram schematically illustrating a vertical cross-section of the example of the substrate processing apparatus preferably used in the embodiments of the present disclosure.

As shown in FIGS. 1 and 2, the processing apparatus 2 includes two adjacent process modules 3A and 3B. The process module 3A is constituted by a process furnace 4A and the transfer chamber 6A. The process module 3B is constituted by a process furnace 4B and the transfer chamber 6B. The transfer chambers 6A and 6B are provided under the process furnaces 4A and 4B, respectively. The transport chamber 8 is disposed adjacent to the transfer chambers 6A and 6B, and is provided with a transfer structure 7 configured to transfer a wafer W. More specifically, the transport chamber 8 is provided in front of the transfer chambers 6A and 6B. The storage chamber 9 configured to accommodate a pod (also referred to as a "FOUP") 5 capable of storing a plurality of wafers including the wafer W is connected to the transport chamber 8. More specifically, the storage chamber 9 is provided in front of the transport chamber 8. Hereinafter, the plurality of wafers including the wafer W may also be referred to as "wafers W". An I/O port 22 is provided on a front surface of the storage chamber 9 such that the pod 5 can be transferred (loaded) into or transferred (unloaded) from the processing apparatus 2 through the I/O port 22.

On a boundary wall (adjacent surface) between the transport chamber 8 and the transfer chambers 6A and 6B, gate valves 90A and 90B are provided, respectively. Pressure detectors (not shown) are provided at the transport chamber 8 and the transfer chambers 6A and 6B, respectively. An inner pressure of the transport chamber 8 may be set to be lower than an inner pressure of the transfer chamber 6A and an inner pressure of the transfer chamber 6B. Further, oxygen concentration detectors (not shown) are provided at the transport chamber 8 and the transfer chambers 6A and 6B, respectively. Oxygen concentrations in the transport chamber 8 and the transfer chambers 6A and 6B are maintained lower than an oxygen concentration in an outer atmosphere.

A clean air supply structure (not shown) through which clean air is supplied into the transport chamber 8 is provided at a ceiling of the transport chamber 8. The clean air supply structure is configured such that the clean air such as an inert gas is circulated in the transport chamber 8 through the clean air supply structure. By circulating the inert gas and purging an inner portion of the transport chamber 8 with the inert gas, it is possible to maintain an inner atmosphere of the transport chamber 8 at a clean atmosphere. With such a configuration, it is possible to prevent (or suppress) a substance such as particles in the transfer chambers 6A and 6B from entering the transport chamber 8. It is also possible to prevent (or suppress) a natural oxide film from being formed on the wafer W in the transport chamber 8 or in the transfer chambers 6A and 6B.

Since configurations of the process module 3A and the process module 3B are substantially the same, the process module 3A will be representatively described below, and a detailed description of the process module 3B will be omitted.

Figure 3:
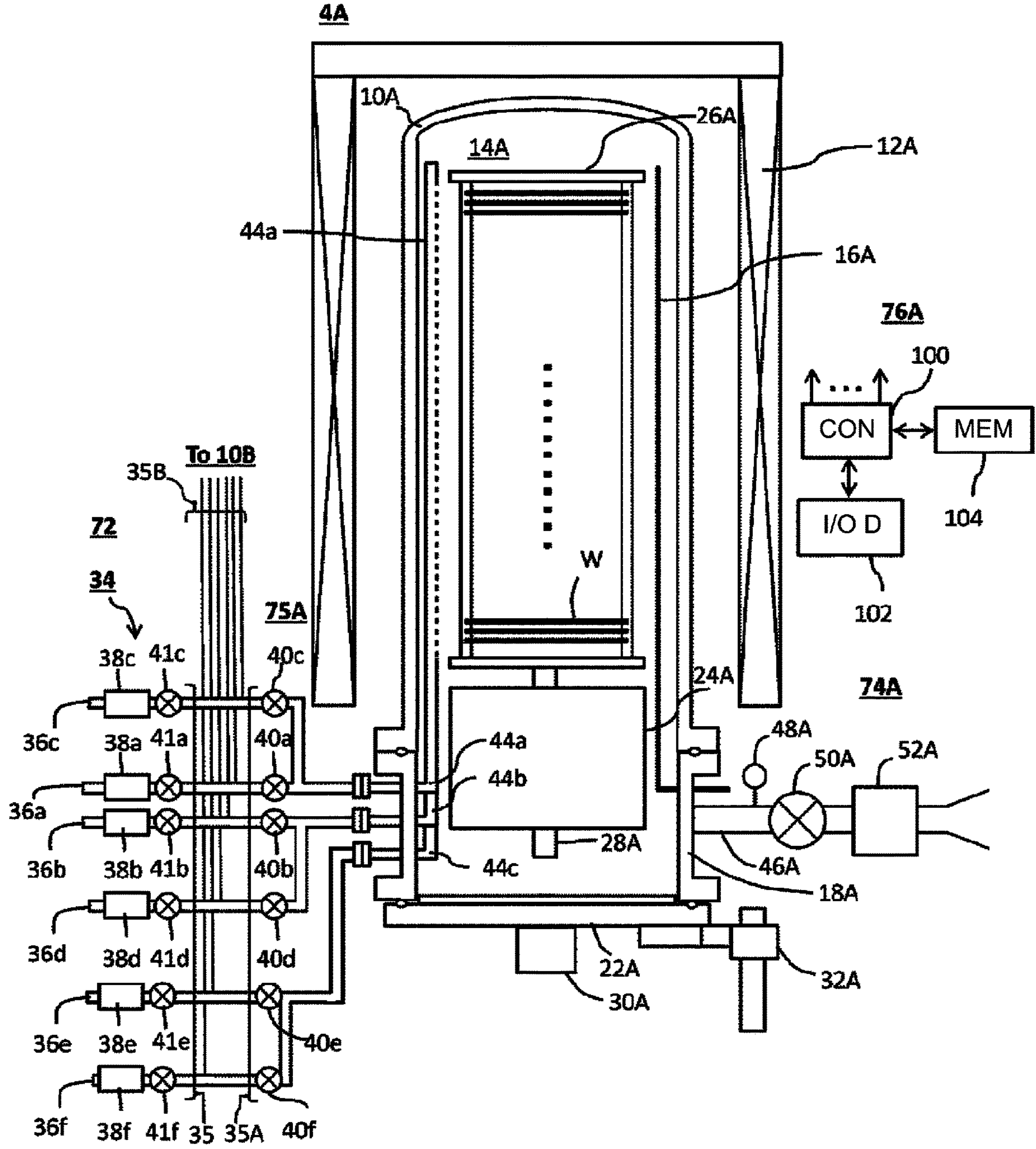
FIG. 3 is a diagram schematically illustrating another vertical cross-section of the example of the substrate processing apparatus preferably used in the embodiments of the present disclosure.

As shown in FIGS. 2 and 3, the process furnace 4A includes a reaction tube 10A of a cylindrical shape and a heater 12A serving as a heating structure (heating apparatus) installed around an outer circumference of the reaction tube 10A. For example, the reaction tube 10A is made of a material such as quartz and silicon carbide (SiC). A process chamber 14A in which the wafer W serving as a substrate is processed is provided in the reaction tube 10A. A temperature detector 16A serving as a temperature meter is installed in the reaction tube 10A. For example, the temperature detector 16A is vertically installed along an inner wall of the reaction tube 10A.

A gas used for the substrate processing is supplied into the process chamber 14A through a gas supply structure (which is a gas supply system or a gas supplier) 34. The gas supplied through the gas supply structure 34 may be changed depending on a type of a film to be formed. For example, the gas supply structure 34 includes a source gas supplier (which is a source gas supply system or a source gas supply structure), a reactive gas supplier (which is a reactive gas supply system or a reactive gas supply structure) and an inert gas supplier (which is an inert gas supply system or an inert gas supply structure). The gas supply structure 34 is accommodated in a supply box 72 described later. Since the supply box 72 is commonly provided for the process modules 3A and 3B, the supply box 72 may be regarded as a common supply box.

The source gas supplier serving as a first gas supplier (which is a first gas supply system or a first gas supply structure) includes a gas supply pipe 36*a*. A mass flow controller (MFC) 38*a* serving as a flow rate controller (flow rate control structure) and valves 41*a* and 40*a* serving as opening/closing valves are sequentially provided at the gas supply pipe 36*a* in this order from an upstream side to a downstream side of the gas supply pipe 36*a* in a gas flow direction. The gas supply pipe 36*a* is connected to a nozzle 44*a* passing through a side wall of a manifold 18A. The nozzle 44*a* is installed along a vertical direction within the reaction tube 10A. The nozzle 44*a* is provided with a plurality of supply holes opened toward the wafers W accommodated in a boat 26A. A source gas is supplied to the wafers W through the plurality of supply holes of the nozzle 44*a*.

Similarly, a reactive gas is supplied to the wafers W through the reactive gas supplier serving as a second gas supplier (which is a second gas supply system or a second gas supply structure) via a gas supply pipe 36*b*, an MFC 38*b*, a valve 41*b*, a valve 40*b* and a nozzle 44*b*, and an inert gas is supplied to the wafers W through the inert gas supplier via gas supply pipes 36*c* and 36*d*, MFCs 38*c* and 38*d*, valves 41*c* and 41*d*, valves 40*c* and 40*d* and nozzles 44*a* and 44*b*. The nozzle 44*b* is installed along the vertical direction within the reaction tube 10A. The nozzle 44*b* is provided with a plurality of supply holes opened toward the wafers W accommodated in the boat 26A. A reactive gas is supplied to the wafers W through the plurality of supply holes of the nozzle 44*b*. For example, as the reactive gas, a nitrogen-containing gas or an oxygen-containing gas may be supplied to the wafers W.

For example, the gas supply structure 34 further includes a third gas supplier (which is a third gas supply system or a third gas supply structure) through which a gas that contributes to the substrate processing (for example, the source gas and the reactive gas) or a gas that does not contribute to the substrate processing (for example, the inert gas and a cleaning gas) is supplied to the wafers W. In a case where the reactive gas is supplied through the third gas supplier, the reactive gas is supplied to the wafers W through a gas supply pipe 36*e*, an MFC 38*e*, a valve 41*e*, a valve 40*e* and a nozzle 44*c*. In a case where the inert gas or the cleaning gas is supplied through the third gas supplier, the inert gas or the cleaning gas is supplied to the wafers W through a gas supply pipe 36*f*, an MFC 38*f*, a valve 41*f*, a valve 40*f* and the nozzle 44*c*. The nozzle 44*c* is installed along the vertical direction within the reaction tube 10A. The nozzle 44*c* is provided with a plurality of supply holes opened toward the wafers W accommodated in the boat 26A. For example, the source gas is supplied to the wafers W through the plurality of supply holes of the nozzle 44*c*. In the case of supplying the cleaning gas to the wafers W described above, the cleaning gas serving as an etching gas may be supplied to the wafers W, or the cleaning gas may be supplied to dummy wafers (pseudo substrates) which are not product wafers.

As described above, three nozzles 44*a*, 44*b* and 44*c* are provided in the reaction tube 10A such that three types of source gases can be supplied into the reaction tube 10A in a predetermined order or at a predetermined cycle through the nozzles 44*a*, 44*b* and 44*c*. The valves 40*a*, 40*b*, 40*c*, 40*d*, 40*e* and 40*f* connected to the nozzles 44*a*, 44*b* and 44*c* in the reaction tube 10A are supply valves (also referred to as “final valves”), and are provided in a final valve installation structure 75A described later. Hereinafter, each of the valves 40*a*, 40*b*, 40*c*, 40*d*, 40*e* and 40*f* provided in the final valve installation structure 75A may also be referred to as a “first valve”. Further, the valves 40*a*, 40*b*, 40*c*, 40*d*, 40*e* and 40*f* provided in the final valve installation structure 75A may be collectively referred to as “valves 40”, “first valves 40” or “final valves 40”, and each of the valves 40*a*, 40*b*, 40*c*, 40*d*, 40*e* and 40*f* provided in the final valve installation structure 75A may be individually referred to as a “valve 40”, a “first valve 40” or a “final valve 40”. Similarly, three nozzles 44*a*, 44*b* and 44*c* are provided in a reaction tube 10B such that three types of the source gases can be supplied into the reaction tube 10B in a predetermined order or at a predetermined cycle through the nozzles 44*a*, 44*b* and 44*c*. Valves 40*a*, 40*b*, 40*c*, 40*d*, 40*e* and 40*f* connected to the nozzles 44*a*, 44*b* and 44*c* in the reaction tube 10B are supply valves (also referred to as “final valves”), and are provided in a final valve installation structure 75B described later. Hereinafter, each of the valves 40*a*, 40*b*, 40*c*, 40*d*, 40*e* and 40*f* provided in the final valve installation structure 75B may also be referred to as a “second valve”. Further, the valves 40*a*, 40*b*, 40*c*, 40*d*, 40*e* and 40*f* provided in the final valve installation structure 75B may be collectively referred to as “valves 40”, “second valves 40” or “final valves 40”, and each of the valves 40*a*, 40*b*, 40*c*, 40*d*, 40*e* and 40*f* provided in the final valve installation structure 75B may be individually referred to as a “valve 40”, a “second valve 40” or a “final valve 40”.

A plurality of gas supply pipes 35 on output sides of the valves 41*a* through 41*f* branch into a plurality of gas distribution pipes 35A and a plurality of gas distribution pipes 35B. The plurality of gas distribution pipes 35A are connected to the valves 40*a*, 40*b*, 40*c*, 40*d*, 40*e* and 40*f* of the reaction tube 10A, respectively, between the valves 41*a* through 41*f* and the valves 40*a* through 40*f*, and the plurality of gas distribution pipes 35B are connected to the valves 40*a*, 40*b*, 40*c*, 40*d*, 40*e* and 40*f* of the reaction tube 10B, respectively, between the valves 41*a* through 41*f* and the valves 40*a* through 40*f*. The plurality of gas supply pipes 35 may be regarded as a common gas supply pipe for the reaction tubes 10A and 10B.

An exhaust pipe 46A is provided at the manifold 18A. A vacuum pump 52A serving as a vacuum exhaust apparatus is connected to the exhaust pipe 46A via a pressure sensor 48A serving as a pressure detector (pressure detection structure) capable of detecting an inner pressure of the process chamber 14A and an APC (Automatic Pressure Controller) valve 50A serving as a pressure regulator (pressure adjustment structure). With such a configuration, it is possible to set the inner pressure of the process chamber 14A to a process pressure that varies depending on a process of the substrate processing. An exhaust system (which is an exhauster or an exhaust structure) “A” is constituted mainly by the exhaust pipe 46A, the APC valve 50A and the pressure sensor 48A. The exhaust system A is accommodated in an exhaust box 74A described later. The vacuum pump 52A may be installed for a common use for the process modules 3A and 3B.

The process chamber 14A is configured such that the boat 26A serving as a substrate retainer is accommodated in the process chamber 14A. For example, the boat 26A is capable of holding (supporting or accommodating) the wafers W (for example, 25 wafers to 150 wafers) and is formed into a shelf shape vertically in a multistage manner. The boat 26A is supported above a heat insulator 24A by a rotating shaft 28A penetrating through a lid 22A and the heat insulator 24A. The rotating shaft 28A is connected to a rotator 30A provided below the lid 22A. The rotating shaft 28A is configured to be capable of being rotated by the rotator 30A while hermetically sealing an inside of the reaction tube 10A. The lid 22A is vertically driven by a boat elevator 32A serving as an elevating structure. Thereby, the boat 26A and the lid 22A are elevated or lowered together such that the boat 26A is loaded into or unloaded from the reaction tube 10A.

A transfer operation for the wafer W to the boat 26A is performed in the transfer chamber 6A. As shown in FIG. 1, a clean air supply structure 60A is provided on one side surface of the transfer chamber 6A (an outer side surface of the transfer chamber 6A or a side surface opposite to another side surface facing the transfer chamber 6B). The clean air supply structure 60A is configured to circulate the clean air (for example, the inert gas) in the transfer chamber 6A. The inert gas supplied into the transfer chamber 6A is exhausted from the transfer chamber 6A via the boat 26A by an exhauster 62A provided on the side surface facing the transfer chamber 6B (the side surface facing the clean air supply structure 60A) and is supplied again from the clean air supply structure 60A into the transfer chamber 6A (circulation purge). The inner pressure of the transfer chamber 6A may be set to be lower than the inner pressure of the transport chamber 8. Further, the oxygen concentration in the transfer chamber 6A is set to be lower than the oxygen concentration in the outer atmosphere. With such a configuration, it is possible to suppress a formation of the natural oxide film on the wafer W during the transfer operation for the wafer W.

A controller (which is indicated by “CON” in FIG. 3) 100 is connected to the rotator 30A, the boat elevator 32A, the MFCs 38*a* through 38*f* and the valves 41*a* through 41*f*, 40*a* through 40*f* of the gas supply structure 34 and the APC valve 50A so as to control operations thereof. For example, the controller 100 is constituted by a microprocessor (computer) including a CPU (Central Processing Unit), and is configured to control operations of the processing apparatus 2. For example, an input/output device (which is indicated by “I/O D” in FIG. 3) 102 constituted by a component such as a touch panel is connected to the controller 100. The controller 100 may be provided separately for each of the process module 3A and the process module 3B, or the controller 100 may be provided for a common use for the process module 3A and the process module 3B.

Subsequently, configurations provided in a rear portion of the processing apparatus 2 will be described.

As shown in FIG. 1, maintenance ports 78A and 78B are provided on rear surfaces of the transfer chambers 6A and 6B, respectively. The maintenance port 78A is provided on the transfer chamber 6A at a location close to the transfer chamber 6B, and the maintenance port 78B is provided on the transfer chamber 6B at a location close to the transfer chamber 6A. The maintenance ports 78A and 78B are opened and closed by maintenance doors 80A and 80B, respectively. The maintenance doors 80A and 80B are configured to be capable of being rotated around hinges 82A and 82B, respectively. The hinge 82A is provided on the transfer chamber 6A at a location close to the transfer chamber 6B, and the hinge 82B is provided on the transfer chamber 6B at a location close to the transfer chamber 6A. The maintenance area A is provided on a rear surface of the process module 3A at a location close to the process module 3B, and the maintenance area B is provided on a rear surface of the process module 3B at a location close to the process module 3A.

As indicated by imaginary lines (that is, broken lines) in FIG. 1, by rotating the maintenance doors 80A and 80B horizontally around the hinges 82A and 82B toward the maintenance areas A and B (that is, a portion provided behind the transfer chambers 6A and 6B), the maintenance ports 78A and 78B on the rear surfaces of the transfer chambers 6A and 6B are opened. The maintenance door 80A is configured to be capable of being opened up to 180 degrees in a clockwise direction with respect to the transfer chamber 6A, and the maintenance door 80B is configured to be capable of being opened up to 180 degrees in a counter-clockwise direction with respect to the transfer chamber 6B. Alternatively, the maintenance doors 80A and 80B may be configured to be removable for performing a maintenance operation.

A utility system 70 is provided in the vicinity of the rear surfaces of the transfer chambers 6A and 6B. The utility system 70 is arranged between the maintenance areas A and B. The utility system 70 includes final valve installation structures 75A and 75B (which are supply valve boxes serving as valve assemblies), exhaust boxes 74A and 74B, the supply box 72 and controller boxes 76A and 76B. That is, the utility system 70 is constituted by the exhaust boxes 74A and 74B, the supply box 72 and the controller boxes 76A and 76B sequentially provided in this order from a housing (that is, from the transfer chambers 6A and 6B) of the processing apparatus 2.

The final valve installation structures 75A and 75B are provided above the exhaust boxes 74A and 74B. Maintenance ports of the boxes of the utility systems 70A and 70B are provided so as to face the maintenance areas A and B, respectively. The supply box 72 is disposed adjacent to the exhaust box 74A opposite to the transfer chamber 6A with the exhaust box 74A interposed therebetween, and adjacent to the exhaust box 74B opposite to the transfer chamber 6B with the exhaust box 74B interposed therebetween.

For example, in the process module 3A, the final valve installation structure 75A (in which the first valves of the gas supply structure 34 (that is, the valves 40*a*, 40*b* and 40*c* located most downstream in the gas supply system) are installed) is arranged above the exhaust box 74A. With such a configuration, it is possible to shorten a length of piping from each first valve to the process chamber. Thereby, it is possible to improve a quality of the film to be formed. Although not shown, in addition to the valves 40*a*, 40*b* and 40*c*, the valves 40*d*, 40*e* and 40*f* are also arranged in the final valve installation structure 75A. Although descriptions thereof are omitted, a configuration of the process module 3B is substantially the same as that of the process module 3A.

The gas supply system (the gas supply structure) 34 through which gases such as nitrogen (N2) gas serving as the inert gas, the reactive gas, the source gas and the cleaning gas (also referred to as a "GCL") are supplied will be described with reference to FIG. 4. Since a configuration of the final valve installation structure 75A is substantially the same as that of the final valve installation structure 75B, the final valve installation structure 75A will be mainly described, and detailed descriptions of the final valve installation structure 75B will be omitted.

The source gas can be supplied to the nozzles 44*a* of the reaction tubes 10A and 10B via a valve 42*a*, the MFC 38*a*, the valve 41*a* and the valves 40*a* of the final valve installation structures 75A and 75B provided in the vicinity of the process chambers 14A and 14B.

The reactive gas can be supplied to the nozzles 44*b* of the reaction tubes 10A and 10B via a valve 42*b*, the MFC 38*b*, the valve 41*b* and the valves 40*b* of the final valve installation structures 75A and 75B provided in the vicinity of the process chambers 14A and 14B. In addition, the reactive gas can be supplied to the nozzles 44*c* of the reaction tubes 10A and 10B via a valve 41*b*2 and the valves 40*f* of the final valve installation structures 75A and 75B.

The N2 gas serving as the inert gas can be supplied to the nozzles 44*a* of the reaction tubes 10A and 10B via a valve 42*d*, the MFC 38*c*, the valve 41*c* and the valves 40*c* of the final valve installation structures 75A and 75B provided in the vicinity of the process chambers 14A and 14B. In addition, the N2 gas can be supplied to the nozzles 44*b* of the reaction tubes 10A and 10B via the valve 42*d*, the MFC 38*d*, the valve 41*d* and the valves 40*d* of the final valve installation structures 75A and 75B. In addition, the N2 gas can be supplied to the nozzles 44*c* of the reaction tubes 10A and 10B via the valve 42*d*, the MFC 38*f*, the valve 41*f* and the valves 40*f* of the final valve installation structures 75A and 75B.

The cleaning gas (GCL) can be supplied to an entirety of the nozzles 44*a*, 44*b* and 44*c* of the reaction tubes 10A and 10B via a valve 42*g*, an MFC 38*g*, a valve 41*g* and valves 40*g*, 40*g*2 and 40*g*3 of the final valve installation structures 75A and 75B.

Figure 4:
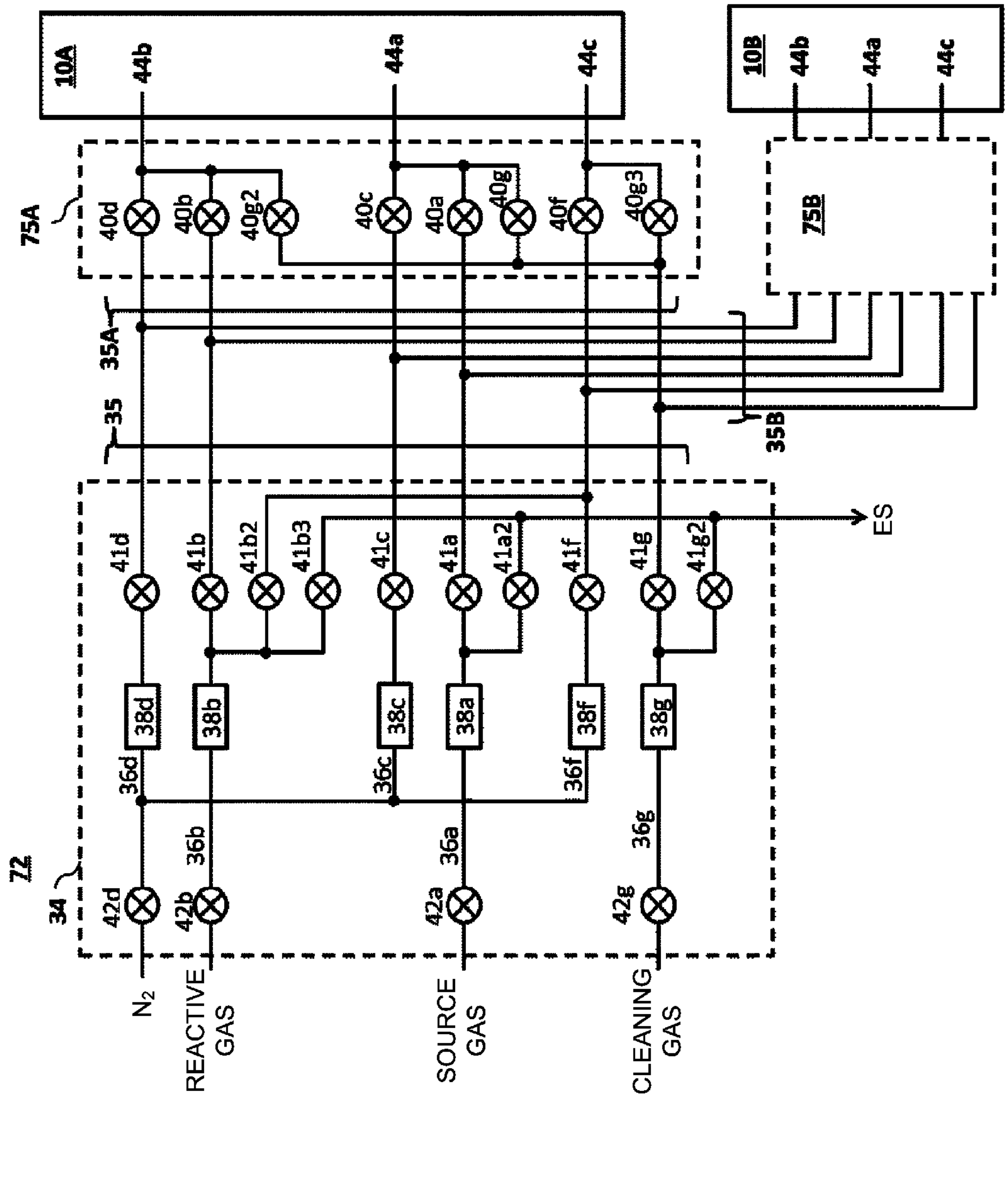
FIG. 4 is a diagram schematically illustrating a vertical cross-section of an example of a gas supply system preferably used in the embodiments of the present disclosure.

Further, a valve 41*a*2 provided at downstream of the MFC 38*a*, a valve 41*b*3 provided at downstream of the MFC 38*b* and a valve 41*g*2 provided at downstream of the MFC 38*g* are connected to the exhaust system ("ES" shown in FIG. 4).

As shown in FIG. 4, the plurality of gas supply pipes 35 (which are distribution pipes on a downstream side of the gas supply system 34) branch into the plurality of gas distribution pipes 35A connected to the final valve installation structure 75A and the plurality of gas distribution pipes 35B connected to the final valve installation structure 75B. Lengths of the plurality of gas distribution pipes 35A after branching are substantially the same as lengths of the plurality of gas distribution pipes 35B after branching. In the plurality of gas supply pipes 35, components such as a heater, a filter, a check valve, a buffer tank are appropriately provided.

The plurality of first valves (also referred to as a "first valve group") of the process module 3A (that is, the valves 40*a* through 40*d*, 40*f*, 40*g*, 40*g*2 and 40*g*3) are provided directly in front of the three nozzles (also referred to as "injectors") 44*a*, 44*b* and 44*c* of the reaction tube 10A of the process module 3A. For example, the controller 100 is configured to be capable of directly controlling a supply of the gas to the injectors. The first valve group shown in FIG. 4 (that is, the valves 40*a* through 40*d*, 40*f*, 40*g*, 40*g*2 and 40*g*3) is capable of simultaneously supplying (that is, mixing and supplying) a plurality of gases to one of the injectors 44*a*, 44*b* and 44*c*. Further, the cleaning gas (GCL) supplied through a gas supply pipe such as a gas supply pipe 36*g* is capable of being supplied to the entirety of the injectors 44*a*, 44*b* and 44*c*. The valves 40*a* through 40*d*, 40*f*, 40*g*, 40*g*2 and 40*g*3 of the process module 3B (which serve as a first valve group of the process module 3B) are substantially the same as the valves 40*a* through 40*d*, 40*f*, 40*g*, 40*g*2 and 40*g*3 of the process module 3A (which serve as the first valve group of the process module 3A), respectively.

As shown in FIG. 4, both of a fluid that contributes to a processing (that is, the substrate processing) of the wafer W and a fluid that does not contribute to the processing of the wafer W are supplied to the process chambers 14A and 14B through the final valve installation structures 75A and 75B. In the present embodiments, the fluid that contributes to the processing of the wafer W may refer to a process gas such as the source gas, the reactive gas, a modification gas and the etching gas, may refer to a gaseous mixture of a combination of the gases exemplified as the process gas, or may refer to a gaseous mixture of the process gas and the inert gas. For example, and the fluid that does not contribute to the processing of the wafer W may refer to the inert gas. In the present embodiments, the fluid that does not contribute to the processing of the wafer W may also refer to the cleaning gas.

Figure 5:
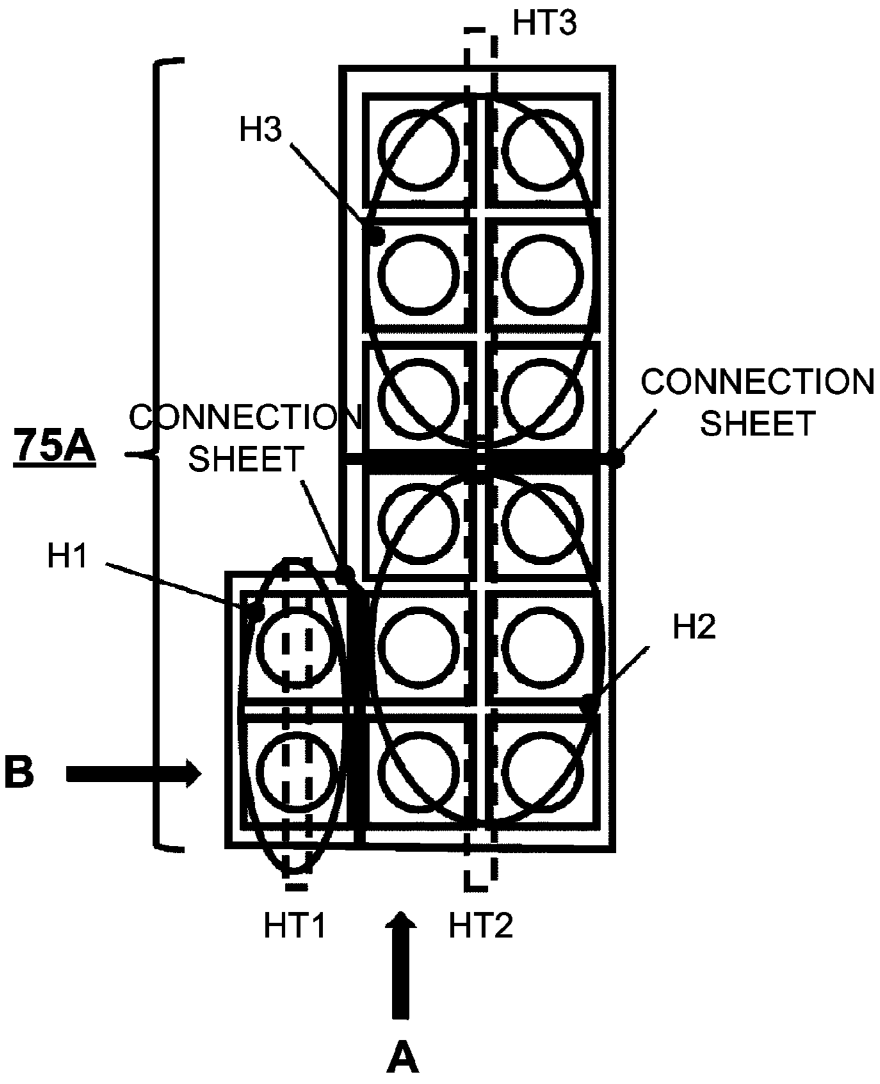
FIG. 5 is a diagram schematically illustrating an example of a final valve installation structure preferably used in the embodiments of the present disclosure when viewed from above.

Subsequently, the final valve installation structure 75A in which the final valves 40 are arranged according to the present embodiments of the present disclosure will be described with reference to FIG. 5. Although the configuration of the final valve installation structure 75A shown in FIG. 5 is different from that of the final valve installation structure 75A shown in FIG. 4, it is illustrated for the purpose of explanation. Thus, the configuration of the final valve installation structure 75A shown in FIG. 5 does not need to be the same as the configuration of the final valve installation structure 75A shown in FIG. 4. Since the configuration of the final valve installation structure 75B is substantially the same as that of the final valve installation structure 75A, the detailed descriptions of the final valve installation structure 75B will be omitted, and the final valve installation structure 75A will be described below. Hereinafter, the final valve installation structure 75A and the final valve installation structure 75B may also be collectively or individually referred to as a "final valve installation structures 75".

FIG. 5 is a diagram schematically illustrating an example of the final valve installation structure 75A when viewed from above. In FIG. 5, heaters HT1, HT2 and HT3 serving as heating structures (heating apparatuses) are shown as elongated rectangles (squares) indicated by imaginary lines (that is, broken lines), and heating regions H1, H2 and H3 are shown as circles indicated by solid lines. The heating regions H1, H2 and H3 are provided for the heaters HT1, HT2 and HT3 and thermocouples TC1, TC2 and TC3 (not shown) serving as temperature sensors, respectively. A connection sheet serving as an adjustment structure capable of adjusting a heat conduction is arranged at a gap between the heating regions H1, H2 and H3. In FIG. 5, the connection sheet is shown as a solid line between the heating regions H1, H2 and H3. Although the heaters HT1, HT2 and HT3 are not visible when viewed from above, the heaters HT1, HT2 and HT3 are illustrated by the imaginary lines (broken lines) for convenience in explaining the heating regions H1, H2 and H3. In the present embodiments, the heating regions H1, H2 and H3 may also be collectively referred to as "heating regions H" or individually referred to as a "heating region H". That is, in the present specification, the term "heating regions H" may refer to an entirety of the heating regions H1, H2 and H3, and the term "heating region H" may refer to one of the heating regions H1, H2 and H3. Similarly, in the present embodiments, the heaters HT1, HT2 and HT3 may also be collectively referred to as "heaters HT" or individually referred to as a "heater HT". That is, in the present specification, the term "heaters HT" may refer to an entirety of the heaters HT1, HT2 and HT3, and the term "heater HT" may refer to one of the heaters HT1, HT2 and HT3.

By heating with each of the heaters HT, a temperature of the final valve installation structure 75A is controlled to a predetermined temperature or higher. In particular, when a source material in a liquid state (or in a solid state) at a room temperature (normal temperature) is used, the temperature is controlled so as to be equal to or higher than a vaporization temperature (or a sublimation temperature) of the source material. In addition, each of the heaters HT is configured to be capable of being controlled individually. According to the present embodiments, since heat equalizing plates serving as a heat equalizing structure are provided, it is possible to uniformly heat an inside of the heating region H. However, when the heating regions H are provided, the gap between the heating regions H (between the heat equalizing plates) serve as an air layer. As a result, the heat may be easily dissipated, and a non-uniformity of the temperature is likely to occur. However, in FIG. 5, since the connection sheet serving as the adjustment structure capable of adjusting the heat conduction between the heat equalizing plates is provided between the heating regions H, it is possible to suppress the non-uniformity of the temperature. Details thereof will be described later.

Figure 6:
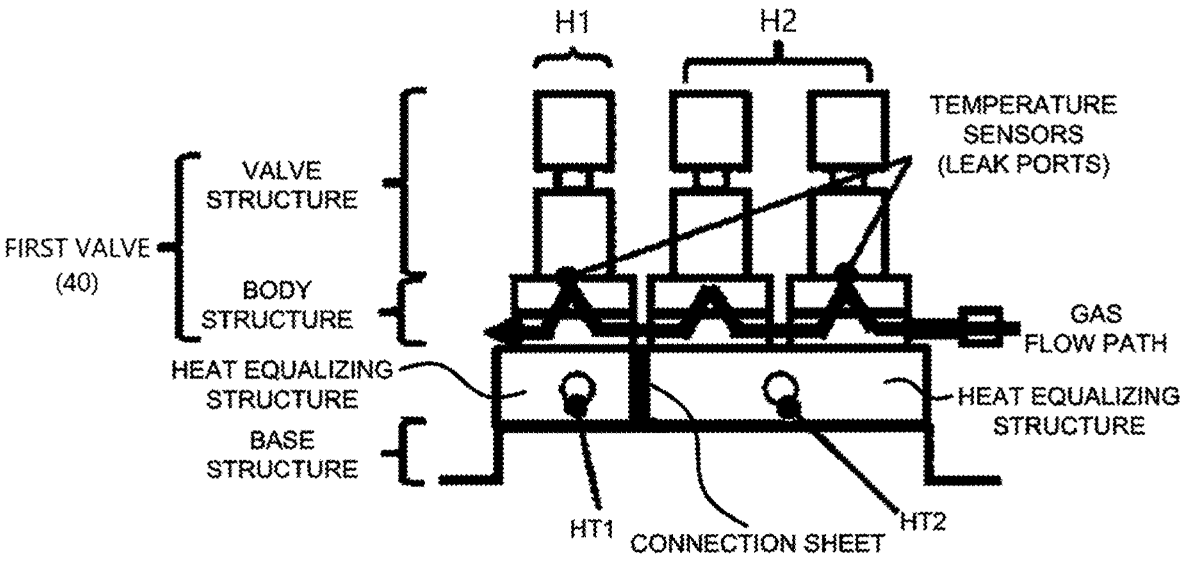
FIG. 6 is a diagram schematically illustrating a vertical cross-section of the example of the final valve installation structure preferably used in the embodiments of the present disclosure, taken along a direction "A" shown in FIG. 5.
Figure 10:
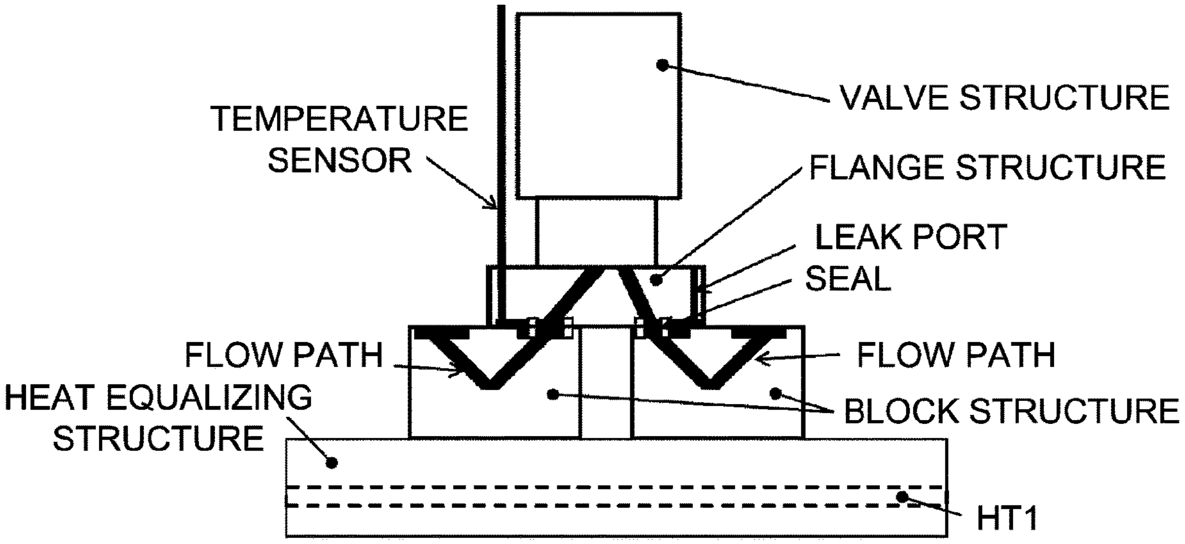
FIG. 10 is a diagram schematically illustrating a vertical cross-section of the example of the final valve preferably used in the embodiments of the present disclosure, taken along a direction "B" shown in FIG. 5.

Subsequently, the configuration and operation of the first valve group 40 (that is, the first valves 40) serving as the first valve group according to the embodiments of the present disclosure will be described with reference to FIGS. 6 and 10. The first valves 40 (or the second valves 40) in the final valve installation structure 75A (or the final valve installation structure 75B) may refer to valves provided at locations closest to the process chamber 14A (or the process chamber 14B) (on downstream side thereof) among the valves provided in piping communicating with the process chamber 14A (or the process chamber 14B). In the present embodiments, the final valve installation structure 75A (or the final valve installation structure 75B) is provided with the valves 40 serving as a final valve group (first valve group), and is constituted by a configuration including at least: (from a lowermost portion to an uppermost portion thereof in the vertical direction) a base structure; the heat equalizing plates serving as the heat equalizing structure; a block structure provided with flow paths through which the fluid that contributes to the processing of the wafer W and the fluid that does not contribute to the processing of the wafer W are respectively supplied; a valve structure capable of opening and closing the flow paths by driving (or vertically moving) valves (not shown); and a flange structure provided between the block structure and the valve structure. Further, the first valves 40 serving as the first valves according to the present embodiments are constituted by the flange structure and the valve structure described above. The connection sheet serving as the adjustment structure capable of adjusting the heat conduction in the heat equalizing structure (described later) is provided at the gap between the heat equalizing plates described later. Each of the heat equalizing plates is made of an alloy, which will be described later. Examples of the flow paths are shown in FIGS. 6 and 10. In FIGS. 6 and 10, details of piping between the first valves 40 or details of the flow paths in the block structure are omitted. However, various flow paths are provided in the block structure by combining various shapes of the block structure. Openings are provided in the block structure through which the fluid flows. By supplying (or flowing) the gas through the openings of the block structure, various flow paths such as branches and confluences are provided. In FIG. 5, the reason why the final valve installation structure 75A is divided into two rows or three rows is that the first valves 40 are arranged in consideration of the space efficiency in order to arrange the final valve installation structure 75A in a limited space.

As shown in FIG. 6, the base structure is provided in common for the first valves 40. When general-purpose valves are combined, the space for arranging the valves becomes large because the valves are connected by joints. However, by using the base structure, a space-saving valve integrated structure can be realized. Specifically, it is possible to arrange the heat equalizing structure and the block structure to be adjacent to each other on the base structure. Thereby, it is possible to configure the first valve group in the configuration shown in FIG. 5. Further, it is possible to combine the first valve 40 with another adjacent first valve 40 through the block structure, and it is also possible to provide various flow paths in each block structure.

The heat equalizing structure is divided for each of the heating regions H, and as shown in FIG. 6, the heaters HT serving as cartridge heaters are provided inside each division of the heat equalizing structure, respectively. The heat equalizing structure is constituted by an aluminum block made of an aluminum alloy, and a hole is provided therein so as to install the heater HT. Since a through-hole processing is performed on the aluminum block, there is a limit to a size of the aluminum block to some extent. For this reason, when the final valve installation structure 75A becomes large, it is possible to increase the number of the heaters HT and the heating regions H. As a result, it is possible to divide the heat equalizing structure for each heating region H. According to the present embodiments, the connection sheet is inserted between each adjacent pair among the heating regions H (that is, a boundary between the heating region H1 and the heating region H2). For example, by suppressing the heat leakage at the boundary between the heating regions H, it is possible to suppress an occurrence of a cold spot between the heating regions H.

As shown in FIG. 10, a plurality of temperature sensors are installed at a plurality of leak ports adjacent to the flow paths (gas flow paths) provided within the block structure or the flange structure, respectively. As a result, since the temperature sensors can be arranged in the immediate vicinity of the flow paths, it is possible to detect the temperature close to an actual temperature of the gas. In the present embodiments, each of the leak ports refers to a port for attaching thereto a check jig to check whether or not the gas leaks. A periphery of a portion where the gas flow path in the flange structure and the gas flow path in the block structure are connected is sealed by a seal so as to block the flow paths from an outer atmosphere, and the flange structure and the block structure are fixed. For example, each of the flange structure and the block structure is made of SUS (stainless used steel). In addition, although not shown, in the present embodiments, the plurality of temperature sensors are paired respectively with a plurality of thermoswitches (thermal over-temperature switches) are provided as a set.

In FIGS. 6 and 10, the gas flow paths can be opened or closed by operating a valve (for example, a diaphragm valve) (not shown) provided in the valve structure. Thereby, it is possible to start a supply of the gas or stop the supply of the gas. Further, as shown in FIG. 10, an input side or an output side of the block structure is configured to be capable of being connectable to (the flange structure of) another first valve 40 (not shown). The flow paths at an input end and an output end of the block structure occupy large cross-sectional areas because the seal communicates with the leak ports provided on the flange structure when the seal is connected to the flange structure. With such a configuration, it is possible to check for the gas leak from the seal.

As the semiconductor device is miniaturized and complicated recently, a wide variety of source gases are used and the gas supply system 34 is also configured in a complicated manner. Thereby, the final valve installation structure 75A in which the valves are integrated according to the present embodiments may be used. As shown in FIG. 6, according to the configuration of the first valve group 40, it is possible to uniformly heat the final valve installation structure 75A (in which the valves are integrated) to a predetermined temperature. As a result, it is possible to stably supply the fluid that contributes to the processing of the wafer W to the process chamber 14A without causing a phase change such as re-liquefaction. The configuration of the connection sheet will be described later.

A memory (which is indicated by “MEM”) 104 shown in FIG. 3 may be configured as a memory (for example, a hard disk and a flash memory) embedded in the controller 100, or may be configured as a portable external memory (for example, a magnetic tape, a magnetic disk such as a flexible disk and a hard disk, an optical disk such as a CD and a DVD, a magneto-optical disk such as an MO and a semiconductor memory such as a USB memory and a memory card). In addition, a program (for example, a control program for controlling operations of the processing apparatus 2) may be provided to a computer constituting the controller 100 by using a communication structure such as the Internet and a dedicated line. In response to demands, the program may be read out from the memory 104 in accordance with an operation command inputted from the input/output device 102 shown in FIG. 3. The controller 100 executes a process (that is, the substrate processing) in accordance with the read recipe such that the processing apparatus 2 can execute a desired process under a control of the controller 100. The controller 100 is stored in the controller boxes 76A and 76B. When the controller 100 is provided for each of the process module 3A and the process module 3B, a controller (also referred to as a “controller 100A”) configured to control the process module 3A is stored in the controller box 76A and a controller (also referred to as a “controller 100B”) configured to control the process module 3B is stored in the controller box 76B.

Figure 8:
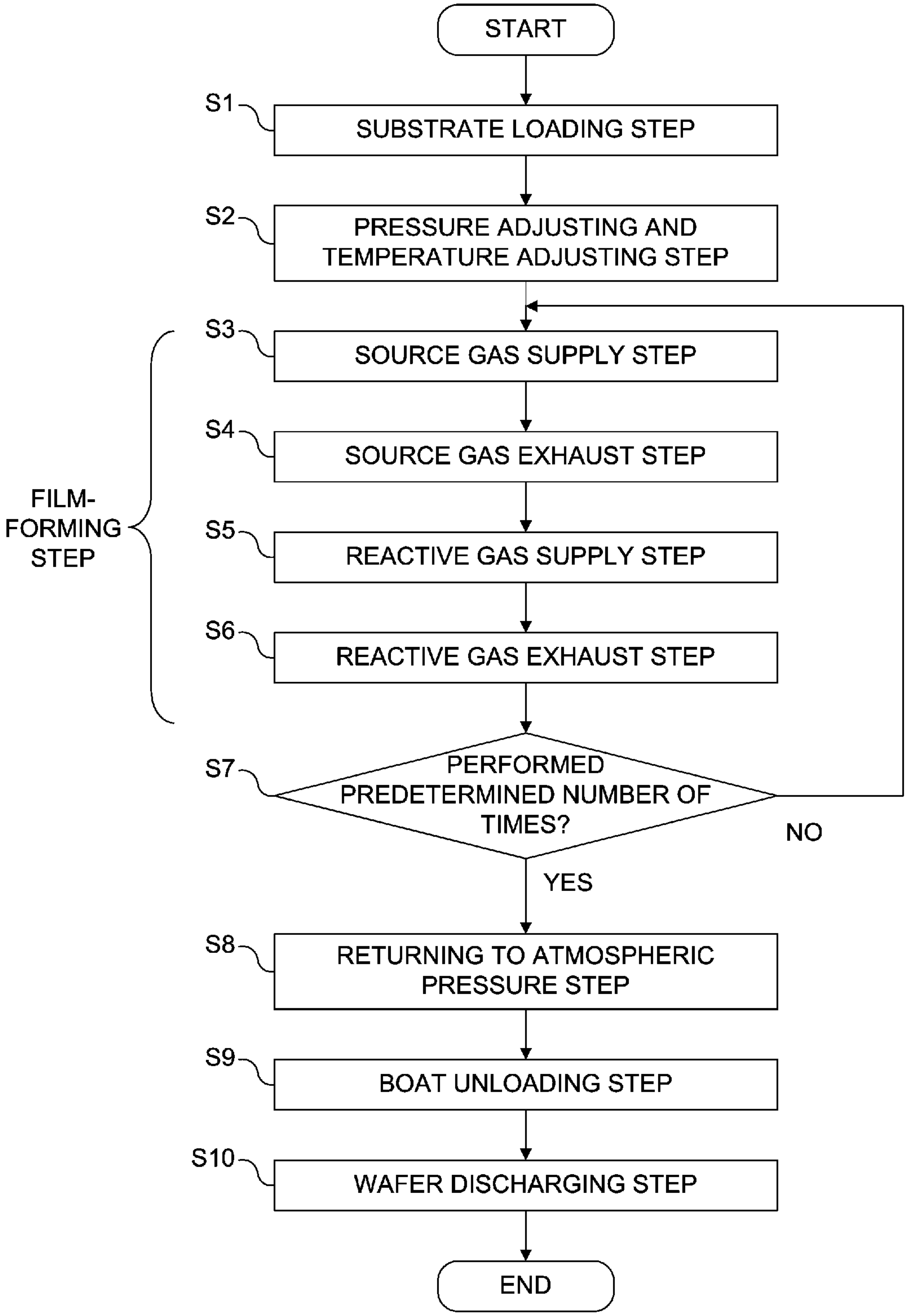
FIG. 8 is a flow chart schematically illustrating an example of a substrate processing according to the embodiments of the present disclosure.

Subsequently, a process (film-forming process) (that is, the substrate processing) of forming a film on the substrate (that is, the wafer W) by using the processing apparatus 2 describe above will be described with reference to FIG. 8. The film-forming process will be described by way of an example in which the film is formed on the wafer W by supplying a first process gas serving as the source gas and a second process gas serving as the reactive gas onto the wafer W. In the following description, operations of the components constituting the processing apparatus 2 are controlled by the controller 100.

In the film-forming process according to the present embodiments, the film is formed on the wafer W by performing a cycle a predetermined number of times (once or more). The cycle may include: a step of supplying the source gas to the wafer W in the process chamber 14A; a step of removing the source gas (residual gas) from the process chamber 14A; a step of supplying the reactive gas to the wafer W in the process chamber 14A; a step of removing the reactive gas (residual gas) from the process chamber 14A.

<Substrate Loading Step (Wafer Charging Step and Boat Loading Step) S1>

The gate valve 90A is opened and the wafer W is transferred into the boat 26A. When the wafers W are transferred (charged) into the boat 26A (wafer charging step), the gate valve 90A is closed. Then, the boat 26A is loaded into the process chamber 14A by the boat elevator 32A (boat loading step). With the boat 26A loaded, a lower end opening of the reaction tube 10A is airtightly closed (or sealed) by the lid 22A.

<Pressure Adjusting and Temperature Adjusting Step S2>

The vacuum pump 52A vacuum-exhausts (decompresses and exhausts) the process chamber 14A such that the inner pressure of the process chamber 14A reaches and is maintained at a predetermined pressure (vacuum degree). The inner pressure of the process chamber 14A is measured by the pressure sensor 48A, and the APC valve 50A is feedback-controlled based on pressure information measured by the pressure sensor 48A. In addition, the heater 12A heats the process chamber 14A such that a temperature of the wafer W accommodated in the process chamber 14A reaches and is maintained at a predetermined temperature. When heating the process chamber 14A, a state of the electric conduction to the heater 12A is feedback-controlled based on temperature information detected by the temperature detector 16A such that a desired temperature distribution of an inner temperature of the process chamber 14A is obtained. Further, the boat 26A and the wafers W accommodated in the boat 26A are rotated by the rotator 30A.

<Film-forming Step>

A film-forming step is performed by performing a cycle including a source gas supply step S3, a source gas exhaust step S4, a reactive gas supply step S5 and a reactive gas exhaust step S6.

<Source Gas Supply Step S3>

When the inner temperature of the process chamber 14A is stabilized at a process temperature set in advance, the source gas is supplied to the wafers W in the process chamber 14A. After a flow rate of the source gas is adjusted to a desired flow rate by the MFC 38*a*, the source gas whose flow rate is adjusted is supplied into the process chamber 14A through the gas supply pipe 36*a*, the valve 41*a*, the valve 40*a* and the nozzle 44*a*.

<Source Gas Exhaust Step S4>

Subsequently, a supply of the source gas is stopped, and an inner atmosphere of the process chamber 14A is vacuum-exhausted by the vacuum pump 52A. When vacuum-exhausting the inner atmosphere of the process chamber 14A, the N2 gas serving as the inert gas may be supplied through the inert gas supplier into the process chamber 14A (purge by the inert gas).

<Reactive Gas Supply Step S5>

Subsequently, the reactive gas is supplied to the wafers W in the process chamber 14A. After a flow rate of the reactive gas is adjusted to a desired flow rate by the MFC 38*b*, the reactive gas whose flow rate is adjusted is supplied into the process chamber 14A through the gas supply pipe 36*b*, the valve 41*b*, the valve 40*b* and the nozzle 44*b*.

<Reactive Gas Exhaust Step S6>

Subsequently, a supply of the reactive gas is stopped, and the inner atmosphere of the process chamber 14A is vacuum-exhausted by the vacuum pump 52A. When vacuum-exhausting the inner atmosphere of the process chamber 14A, the N2 gas serving as the inert gas may be supplied through the inert gas supplier into the process chamber 14A (purge by the inert gas).

<Performing Predetermined Number of Times S7>

By performing the cycle including the four steps S3 through S6 described above a predetermined number of times (once or more), it is possible to form a desired film on the wafer W.

After forming the film, the N2 gas is supplied through the inert gas supplier. Thereby, the inner atmosphere of the process chamber 14A is replaced with the N2 gas, and the inner pressure of the process chamber 14A is returned to an atmospheric pressure (returning to atmospheric pressure step S8). Thereafter, the lid 22A is lowered by the boat elevator 32A, and the boat 26A is unloaded from the reaction tube 10A (boat unloading step S9). Thereafter, the processed wafers W are taken out from the boat 26A (wafer discharging step S10).

Thereafter, the wafers W may be stored in the pod 5 and transferred (unloaded) out of the processing apparatus 2, or may be transferred to the process furnace 4B so that, for example, the substrate processing such as an annealing process can be performed continuously. When continuously processing the wafers W in the process furnace 4B after the processing of the wafers W in the process furnace 4A, the gate valves 90A and 90B are opened, and the wafers W are directly transferred from the boat 26A to a boat 26B. Thereafter, the wafers W are loaded into and unloaded from the process furnace 4B in a manner substantially the same as that of the substrate processing performed by the process furnace 4A described above. In addition, for example, the substrate processing in the process furnace 4B is performed in a manner substantially the same as that of the substrate processing performed by the process furnace 4A described above.

Figure 7A:
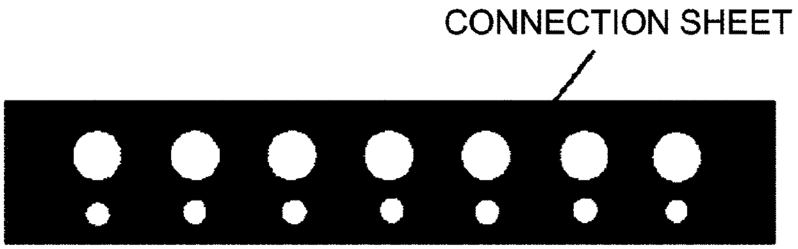
FIG. 7A is a diagram schematically illustrating an example of an adjustment structure provided at a gap between each adjacent pair among heating regions preferably used in the embodiments of the present disclosure.

Subsequently, with reference to FIGS. 7A and 7B, for example, the adjustment structure provided at the boundary (boundary portion) between the heating region H1 and the heating region H2 will be described. The connection sheet serving as the as the adjustment structure shown in FIG. 7A is of a sheet shape, but the adjustment structure is not limited thereto. For example, as a material of the adjustment structure, it is preferable that a thermal conductivity of the material is lower than that of the heat equalizing plates (aluminum alloy) and higher than that of air. For example, the adjustment structure is made of a material such as alumina and SUS.

Further, as shown in FIG. 7A, by providing large holes on an upper portion of the connection sheet and small holes on a lower portion of the connection sheet, the connection sheet is configured such that there is a difference in the thermal conductivity between the upper and lower portions thereof. Due to the difference in the thermal conductivity between the upper and lower portions of the connection sheet, a temperature of a lower portion of the heat equalizing plates is actively increased, and after the heat is equalized on the lower portion of the heat equalizing plates, the heat is gradually transferred to an upper portion of the heat equalizing plates such that the temperature is equalized in the heat equalizing plates.

Figure 7B:
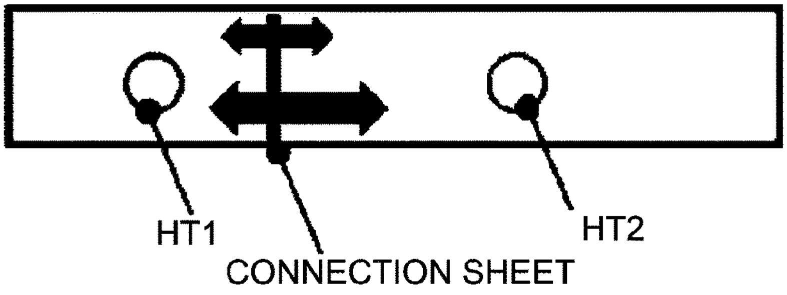
FIG. 7B is a diagram schematically illustrating a heat conduction by the example of the adjustment structure (which is shown in FIG. 7A) provided at the gap between each adjacent pair among the heating regions.

Specifically, as shown in FIG. 7B, in a location far away from the temperature sensors (that is, the lower portion of the heat equalizing plates), by increasing a contact area between the heating regions H1 and H2 through the connection sheet, it is possible to promote the heat conduction (indicated by a lower arrow shown in FIG. 7B), and it is also possible to promote the heating of the gap between the heating regions H. In addition, in a location in the vicinity of the temperature sensors (that is, the upper portion of the heat equalizing plates), by decreasing the contact area between the heating regions H1 and H2 through the connection sheet, it is possible to suppress the heat conduction (indicated by an upper arrow shown in FIG. 7B), and it is also possible to reduce an influence of the heat interference.

As shown in FIG. 7B, by using the connection sheet according to the present embodiments, the thermal conductivity between the upper portion and the lower portion of the heat equalizing structure can vary in the vertical direction. However, the present embodiments are not limited thereto. For example, the thermal conductivity of the heat equalizing structure may vary in the vertical direction in three stages (that is, the upper portion, a middle portion and the lower portion of the heat equalizing structure). Alternatively, a connection sheet whose thermal conductivity gradually varies in the vertical direction may be provided between the heating region H1 and the heating region H2.

Alternatively, since it is sufficient to make the thermal conductivity of the heat equalizing structure different in the vertical direction, it is needless to say that holes may be provided in the upper portion of the connection sheet without providing holes in the lower portion of the connection sheet. Further, the shape of the connection sheet is not limited to a hole shape (circular shape), and may be of a polygonal (triangular or else) shape, a star shape, a rhombic shape, or a fan shape. Moreover, the shape of the connection sheet is not limited to figures described above, and for example, the shape of the connection sheet may be those of characters, numbers or a combination thereof. The shape of the connection sheet may be different between the upper portion and the lower portion of the heat equalizing structure, or a combination of the figures, the characters and the numbers may be used as the shape of the connection sheet in the upper portion and the lower portion of the heat equalizing structure.

Alternatively, since it is sufficient to make the thermal conductivity of the heat equalizing structure different in the vertical direction, the material for the upper portion of the connection sheet may be different from that for the lower portion thereof. It is sufficient that the thermal conductivity of the material for the upper portion of the connection sheet is lower than the thermal conductivity of the material for the lower portion thereof. That is, the material for the upper portion of the connection sheet and the material for the lower portion of the connection sheet may not be the same. For example, the upper portion of the connection sheet may be made of SUS whose thermal conductivity is low, and the lower portion of the connection sheet may be made of alumina whose thermal conductivity is higher than that of SUS.

In such a manner, by using the connection sheet according to the present embodiments to vary the thermal conductivity of the heat equalizing structure in the vertical direction, it is possible to improve a heat uniformity of the final valve installation structure 75A, and it is also possible to obtain an effect of preventing a re-liquefaction (or re-solidification) of the fluid (for example, the gas) flowing through the flow paths or the piping in the block structure or the flange structure.

The present embodiments are described by way of a case where each heating region H is heated to the same temperature. However, in FIG. 5, for example, the heating regions H1 and H2 may have different pre-set temperatures. Therefore, the heaters HT are configured to be capable of heating the heating regions H to the pre-set temperatures, respectively. Further, the heaters HT are configured to be capable of heating the heating regions H to the pre-set temperatures, respectively, depending on a predetermined gas flowing through the flow paths provided in the heating regions H. Specifically, depending on the type of the gas flowing through the heating regions H, the pre-set temperatures may differ for each of the heating regions H of the final valve installation structure 75A. For example, depending on the vaporization temperature of the fluid that contributes to a formation of the film (that is, the processing of the wafer W), each of the heating regions H may be controlled to a different temperature.

For example, in FIG. 5, in a case where a source gas "A" with a vaporization temperature of "A" ° C. flows through the heating region H1 and a source gas "B" with a vaporization temperature of "B" ° C. (wherein B is lower than A) flows through the heating region H2, it is conceivable that each of the heating regions H is uniformly heated to a temperature equal to or higher than the vaporization temperature A ° C. of the source gas A whose vaporization temperature is relatively high. However, depending on the type of the gas, when the vaporization temperature is too high, a reaction may occur excessively. Thereby, a risk of corrosion of a component such as the piping may increase. Therefore, it is preferable to control the temperature such that the temperature becomes close to the vaporization temperature (near a vapor pressure curve) instead of an excessively high temperature. In general, when the vaporization temperature is A ° C., the thermal over-temperature switches (thermoswitches) are provided for detecting a temperature slightly higher than the vaporization temperature (generally by 10% or less). By using the thermal over-temperature switches, it is possible to monitor whether or not the temperature is controlled to an appropriate temperature close to the vaporization temperature.

In addition, there is some concern that the cold spot may occur in the gap between the heating region H1 and the heating region H2 due to the difference in the temperature between the heating region H1 (pre-set temperature A ° C.) and the heating region H2 (pre-set temperature B ° C.). However, according to the present embodiments, by providing the connection sheet at the boundary between the heating region H1 and the heating region H2, it is possible to suppress the occurrence of the cold spot. In addition, by varying the thermal conductivity between the upper portion and the lower portion of the heat equalizing structure in the vertical direction, it is possible to heat each of the heating regions H to the pre-set temperatures or higher. Thereby, it is possible to obtain the effect of preventing the re-liquefaction of each of the source gas A and the source gas B.

Further, in such a case, it is needless to say that the final valve installation structure 75 may be configured separately for each of the heating regions H.

First Modified Example

Figure 9:
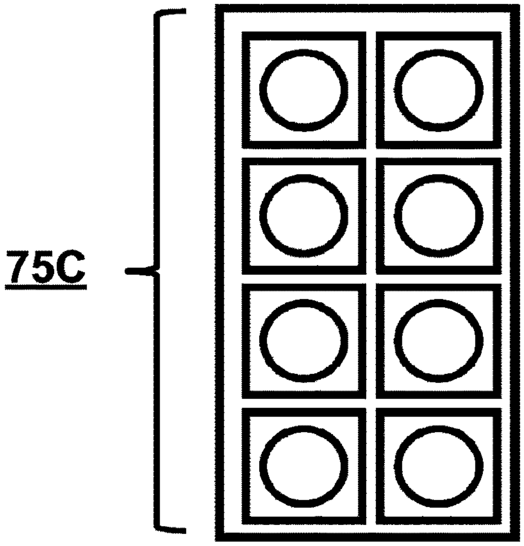
FIG. 9 is a diagram schematically illustrating a modified example of the final valve installation structure preferably used in the embodiments of the present disclosure when viewed from above.

A first modified example will be described with reference to FIG. 9. A configuration of the first modified example shown in FIG. 9 is different from that of the present embodiments shown in FIG. 5 in that no heater is provided. In other words, a configuration of a final valve installation structure 75C shown in FIG. 9 is substantially the same as that of the final valve installation structure 75A shown in FIG. 5 except that a plurality of third valves 40 serving as a final valve group (third valve group) are not heated. According to the present modified example, two final valve installation structures (that is, the final valve installation structure 75C and the final valve installation structure 75A or 75B) are provided. The source material in the liquid state (or in the solid state) at the room temperature should be heated to or above the vaporization temperature (or the sublimation temperature) in order to maintain the source material in a vaporization state or in a sublimation state. Therefore, the source material in the liquid state (or in the solid state) at the room temperature is supplied in a gaseous state to the process chamber 14A through the final valve installation structure 75A or 75B, and the fluid (gas) in the gaseous state at the room temperature is supplied to the process chamber 14A through the final valve installation structure 75C.

According to such a configuration of the present modified example, as compared with a case where a gas that does not need to be heated is also heated since an entirety of the gases supplied to the process chamber 14A are heated by passing through the final valve installation structure 75A or 75B as shown in FIG. 5, it is possible to simplify the final valve installation structure 75A or 75B. In addition to saving a space such as the space for arranging the final valve installation structure 75A or 75B, it is also possible to reduce the power consumption for uniformly heating the final valve installation structure 75A or 75B at a predetermined temperature.

Since the fluid (gas) in the gaseous state at the room temperature is supplied to the process chamber 14A through the final valve installation structure 75C, the final valve installation structure 75A or 75B can be made compact. In addition, it is possible to reduce the number of the heaters (and the number of the thermocouples) to be used. Further, depending on the source gas to be used, it is possible to suppress a useless output of the heater.

For example, the final valve installation structure 75 through which the gas (such as the source gas, the reactive gas and the modification gas or a gaseous mixture (mixed gas) of the gases mentioned above and the inert gas) that contributes to the processing of the substrate (wafer W) passes, another final valve installation structure through which the inert gas that does not contribute to the processing of the substrate passes, and still another final valve installation structure through which a gas (such as the cleaning gas and a gaseous mixture (mixed gas) of the cleaning gas and the inert gas) that does not contribute to the processing of the substrate passes may be separately provided. By distributing the final valve installation structures mentioned above in such a manner, each of the final valve installation structures mentioned above can be made compact. In addition, it is possible to reduce the number of the heaters (and the number of the thermocouples) to be used. Further, depending on the source gas to be used, it is possible to suppress the useless output of the heater. A final valve (or final valves) through which the inert gas that does not contribute to the processing of the substrate passes or a final valve (or final valves) through which the gas (such as the cleaning gas and the gaseous mixture (mixed gas) of the cleaning gas and the inert gas) that does not contribute to the processing of the substrate passes may also be referred to as a "second valve" (or "second valves" or a "second valve group").

Further, it is needless to say that, as an example of the present modified example shown in FIG. 9, there may be a case where some gas that does not need to be heated is not heated even though the heater is provided. The present modified example may also include such case. In addition, it is preferable that a component such as the thermocouples is arranged to monitor the temperature of the final valve installation structure 75.

Second Modified Example

A second modified example will be described. The final valve installation structure 75 according to the second modified example in which the first valves (first valve group) 40 are arranged will be described with reference to FIGS. 11A and 11B. Since the configuration of the first valves 40 and each component constituting the first valves (first valve group) 40 are substantially the same as that of the first valves (first valve group) 40 arranged in the final valve installation structure 75 shown in FIG. 5. Thus, detailed descriptions thereof will be omitted, and differences from the configuration of the final valve installation structure 75 shown in FIG. 5 will be mainly described.

Figure 11A:
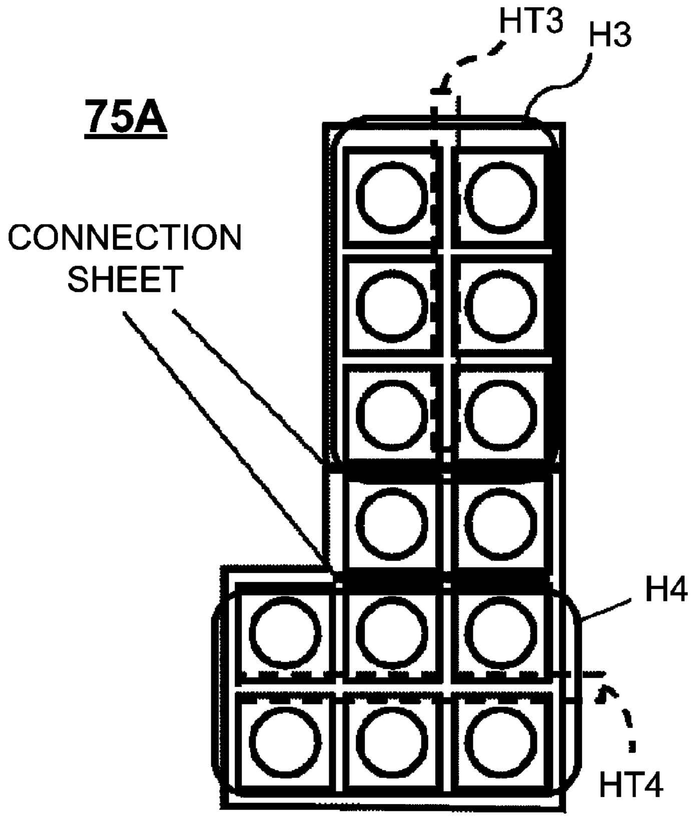
FIG. 11A is a diagram schematically illustrating another modified example of the final valve installation structure preferably used in the embodiments of the present disclosure when viewed from above.
Figure 11B:
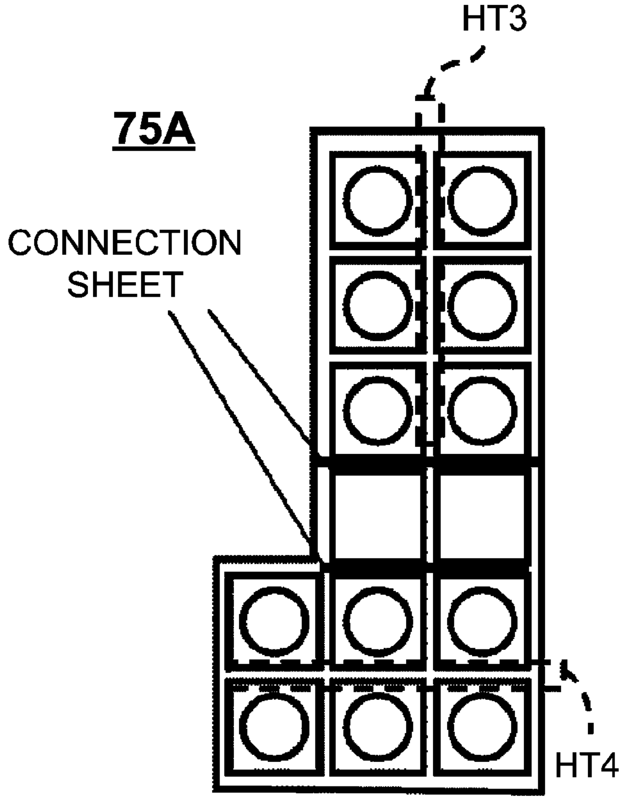
FIG. 11B is a diagram schematically illustrating still another modified example of the final valve installation structure preferably used in the embodiments of the present disclosure when viewed from above, wherein the final valve in the adjustment structure is eliminated.

According to the configuration shown in FIG. 11A, the number of the first valves 40 in the final valve installation structure 75A is the same as that of the first valves 40 in the final valve installation structure 75A shown in FIG. 5, a heater HT4 is used instead of the heater HT2, and the heater HT1 is omitted. In the present modified example, the heater HT3 and the heater HT4 are configured to provide the heating region H3 and a heating region H4, respectively, and ranges of the heating region H3 and the heating region H4 are substantially the same. Actually, it is not always possible to say that a heating capacity of the heater HT3 is the same as that of the heater HT4 due to a reason such as a difference in the power applied to each of the heaters HT3 and HT4. However, in the following description, it is assumed that the heating capacity of the heater HT3 is the same as that of the heater HT4. In FIG. 11B, the heaters HT3 and HT4 are the same as those shown in FIG. 11A, but the respective heating regions H are omitted. According to the configuration shown in FIGS. 11A and 11B, as compared with that shown in FIG. 5, only two heaters, that is, the heaters HT3 and HT4 are provided. Thus, it is possible to expect an energy saving effect.

On the other hand, according to the configuration shown in FIG. 5, the first valves 40 provided in the final valve installation structure 75A can be heated by the heater HT. However, according to the configuration shown in FIG. 11A, there is a high possibility that the heating by the heater HT is insufficient for the first valves 40 located between two connection sheets. Therefore, as shown in FIG. 11B, a configuration in which the first valves 40 are not provided between the two connection sheets is conceivable.

As shown in FIG. 11B, at least a body structure (that is, the valve structure and the flange structure) of the first valves 40 is not arranged between the two connection sheets. Thereby, the fluid is not supplied thereto. As a result, it is possible to separate the heating region H3 and the heating region H4

Alternatively, it is possible to adopt a configuration in which no connection sheet is provided. However, when a temperature difference between an unheated portion and a heated portion is too large, there is a risk that the heat leakage between the two connection sheets will increase. Therefore, it is preferable to provide the connection sheet. In addition, since the connection sheet in such a case serves as a heat insulating material, it is preferable that no notches (cuts) or cutouts are formed there as shown in FIGS. 7A and 7B.

Examples of Present Embodiments

Subsequently, with reference to FIGS. 4, 5, 11A and 11B, the configuration of the first valve group (first valves) 40 in the final valve installation structure 75A and the fluid flowing through the first valves 40 will be described. Although not described, the same also applies to the final valve installation structure 75B.

First Example

Subsequently, in FIG. 5, an electric power ratio for each of the heating regions H involving the heating by each of the heaters HT is set to be a constant for each heating region H. For example, the heaters HT1, HT2 and HT2 are heated in a state where the electric powers applied to the heater HT1, the heater HT2 and the heater HT3 follow a ratio of 1:3:3. In FIG. 5, as shown as the heating regions H2 and H3, each of the heaters HT2 and HT3 is configured to be capable of heating a block whose size is equivalent to six first valves 40, and the heater HT1 is configured to be capable of heating a block whose size is equivalent to a group of the valves (that is, two first valves 40). Then, the connection sheet is provided at the gap between the heating regions (or at the gap between the blocks). As a result, it is possible to heat the process gas in the final valve installation structure 75A to a predetermined temperature or higher. Therefore, for example, it is possible to heat the gas flowing through each of the first valves 40 to the vaporization temperature (or the sublimation temperature) or higher.

In FIG. 5, the type of the fluid flowing through each of the heating regions H2 and H3 provided by the heaters HT2 and HT3 may be different. For example, a block portion (not shown) may be combined with the first valve group 40 constituting the heating region H2 such that the source gas can be supplied, and a block portion (not shown) may be combined with the heating region H3 such that the cleaning gas can be supplied. For example, by adjusting the temperature of the heating region H2 to the vaporization temperature A (or the sublimation temperature A) of the source gas and the temperature of the heating region H3 to the vaporization temperature B (or the sublimation temperature B) of the cleaning gas, it is possible to heat the process gas flowing through each of the first valves 40 in the final valve installation structure 75A to a temperature equal to or higher than the vaporization temperature (or sublimation temperature) of the process gas.

Furthermore, in FIG. 5, the gap between the heating regions H where the connection sheet is arranged is located away from the heaters HT and difficult to be temperature-controlled. Accordingly, the first valves 40 arranged along the connection sheet provided between the heating region H2 and the heating region H3 may be combined with a block portion (not shown) such that the gas in the gaseous state at the room temperature (for example, the reactive gas and the inert gas) flows. Since the fluid flowing in the first valves 40 provided in the gap between the heating regions H does not need to be heated by the heater HT inside the first valves 40, it is preferable that the temperature of the first valve group 40 other than the first valves 40 arranged along the connection sheet can be controlled to the temperature equal to or higher than the vaporization temperature (or sublimation temperature) of the process gas. Thereby, it is possible to expect an improvement in a temperature controllability with respect to the process gas flowing in the final valve installation structure 75A. Further, the first valves 40 may not be provided in a portion extending along the connection sheet arranged between the heating region H2 and the heating region H3 such that the fluid cannot flow. Even in such a case, similarly, it is possible to expect an improvement in the temperature controllability with respect to the process gas flowing in the final valve installation structure 75A.

Alternatively, in FIG. 5, the thermal conductivity of the connection sheet arranged between the heating regions H1 and H2 may be set to be different from the thermal conductivity of the connection sheet arranged between the heating regions H2 and H3. For example, the thermal conductivity may be varied in accordance with a positional relationship with the heater HT, or the thermal conductivity may be varied in accordance with the power supplied to the heater HT. As a result, it is possible to control the temperature of the fluid flowing through the first valves 40 provided in each of the heating region H to a predetermined temperature or higher.

Second Example

Subsequently, in FIGS. 11A and 11B, the electric power ratio for each of the heating regions H involving the heating by each of the heaters HT is set to a constant for each heating region H in a manner similar to the first example shown in FIG. 5. For example, the heaters HT3 and HT4 are heated in a state where the electric power applied to the heater HT3 and the heater HT4 follows a ratio of 1:1. The heating regions H of the heaters HT are indicated by H3 and H4, respectively. The second example will be described below under the assumption that the heating region H of each heater HT that can be appropriately heated is constituted by a block whose size is equivalent to the six first valves 40 arranged in the final valve installation structure 75A.

As shown in FIG. 11A, a region disposed between the two connection sheets is a region outside the heating region H3 and the heating region H4. Thereby, in the first valves 40 arranged in the region, when the source material serving as the process gas is supplied, the temperature control may not be performed appropriately. As a result, the re-liquefaction (or the re-solidification) of the source material is likely to occur. Therefore, it is preferable that, in the region mentioned above, the fluid (which is in the gaseous state at the room temperature such as the reactive gas (reactant) serving as the process gas or the inert gas) that does not need the temperature control (or the heating) is supplied.

In such a manner, the process gas is supplied to each of the heating region H3 and the heating region H4, and the reactive gas (reactant) serving as the process gas or the inert gas is supplied to the first valves 40 arranged in the region disposed between the two connection sheets. Since the heating region H3 and the heating region H4 are separated from each other, it is possible to selectively use the gases based on the types thereof. That is, for example, it is possible to selectively supply the source gas serving as the process gas for the heating region H3 and the cleaning gas serving as the process gas for the heating region H4. Further, it may be configured such that two types of the source gases with different sublimation temperatures (vaporization temperatures) can be supplied as the source gas.

Alternatively, as shown in FIGS. 7A and 7B, the first valves 40 may not be arranged in the area disposed between the two connection sheets. Thereby, it is possible to supply (or flow) the fluid in the heating region H3 and the heating region H4 without flowing the fluid in the area disposed between the two connection sheets where the temperature is highly likely to become unstable. As a result, it is possible to perform the temperature control of the fluid flowing in the heating region H3 or the heating region H4. For example, since the temperature of the fluid can be set to a predetermined temperature or higher, the process gas obtained by sublimating the source material in the solid state or the process gas obtained by vaporizing the source material in the liquid state can be supplied as the fluid. Further, even with such a configuration, since the heating region H3 and the heating region H4 are separated, it is possible to selectively use the gases based on the types thereof. That is, for example, it is possible to selectively supply the process gas for the heating region H3 through the first valves 40 arranged in the heating region H3 and the process gas for the heating region H4 through the first valves 40 arranged in the heating region H4. Further, it may be configured such that two types of the source gases with different sublimation temperatures (vaporization temperatures) can be supplied as the source gas.

Other Embodiments of Present Disclosure

While the technique of the present disclosure is described in detail by way of the embodiments mentioned above, the technique of the present disclosure is not limited thereto. The technique of the present disclosure may be modified in various ways without departing from the scope thereof.

For example, the final valve installation structures may be provided in a distributed manner in accordance with the type of the gas. Specifically, the final valve installation structures may be provided in a distributed manner for each gas (such as the source gas, the reactive gas and the modification gas) that contributes to the processing of the substrate (that is, the wafer W). Then, the temperature of each of the final valve installation structures may be controlled to different temperatures. On the other hand, in a case where the vaporization temperature (or the sublimation temperature) of each gas is approximately the same regardless of the type of the gas, the gas that contributes to the processing of the substrate and the gas that does not contribute to the processing of the substrate may be supplied to the process chamber through the same final valve installation structure.

For example, the embodiments mentioned above are described by way of an example in which the heat equalizing plates (heat equalizing structures) are provided for the heating regions, respectively. However, the technique of the present disclosure is not limited thereto. For example, a common heat equalizing plate (heat equalizing structure) may be provided in the heating regions, and notches (cuts) may be formed at the boundary portion between each adjacent pair among the heating regions to reduce a heat transfer area. However, in such a case, there is a problem with the strength of the final valve installation structure, and it is preferable to take measures such as inserting a reinforcing material in the notches of the boundary portion. It is also preferable that a heat insulator is used as the reinforcing material.

For example, the embodiments mentioned above are described by way of an example in which the N2 gas is used as the inert gas. However, the technique of the present disclosure is not limited thereto. For example, a rare gas such as argon (Ar) gas, helium (He) gas, neon (Ne) gas and xenon (Xe) gas may be used as the inert gas, and one or more of the rare gases described above may also be used as the inert gas. However, in such a case, a rare gas supply source should be provided so as to supply the rare gas.

For example, as the nitrogen-containing gas, one or more of nitrous oxide (N2O) gas, nitrogen monoxide (NO) gas, nitrogen dioxide (NO2) gas, ammonia (NH3) gas and the like may be used. For example, as the oxygen-containing gas, one or more of oxygen (O2) gas, ozone (O3) gas and the like may be used.

For example, the reactant contained in the reactive gas is not limited to the nitrogen-containing gas or the oxygen-containing gas. For example, other film-forming gases that react with the source gas may be used to form a different type of film. In addition, three or more reactive gases (process gases) may be used to perform a film-forming process.

For example, the embodiments mentioned above are described by way of an example in which the film-forming process of the semiconductor device is performed as the substrate processing of the substrate processing apparatus. However, the technique of the present disclosure is not limited thereto. That is, in addition to the film-forming process or instead of the film-forming process described in the embodiments, the technique of the present disclosure may be applied to a process such as a process of forming an oxide film, a process of forming a nitride film and a process of forming a film containing a metal. In addition, the specific contents of the substrate processing are not limited to those exemplified in the embodiments. For example, in addition to the film-forming process or instead of the film-forming process described in the embodiments, the technique of the present disclosure may be preferably applied to other substrate processing (process) such as an annealing process, an oxidation process, a nitridation process, a diffusion process and a lithography process.

The technique of the present disclosure may also be preferably applied to other substrate processing apparatuses such as an annealing processing apparatus, an oxidation processing apparatus, a nitridation processing apparatus, an exposure apparatus, a coating apparatus, a drying apparatus, a heating apparatus, an apparatus using a plasma and combinations thereof.

For example, the embodiments mentioned above are described by way of an example in which the manufacturing process of the semiconductor device is performed. However, the technique of the present disclosure is not limited thereto. For example, the technique of the present disclosure may be applied to various substrate processing (various processes) such as a manufacturing process of a liquid crystal device, a manufacturing process of a solar cell, a manufacturing process of a light emitting device, a processing of a glass substrate, a processing of a ceramic substrate and a processing of a conductive substrate.

The technique of the present disclosure may also be applied when a constituent of one of the examples described above is substituted with another constituent of other examples, or when a constituent of one of the examples described above is added by another constituent of other examples. In addition, the technique of the present disclosure may also be applied when the constituent of the examples is omitted or substituted, or when a constituent is added to the examples.

According to some embodiments of the present disclosure, it is possible to supply the source gas into the process chamber without causing the phase change.

What is claimed is:

1. A gas supply system comprising:

a plurality of first valves capable of opening and closing one or more flow paths through which one or more fluids that contribute to a processing of a substrate are supplied to a process chamber;

a base structure provided below the plurality of first valves to extend along a horizontal direction of the plurality of first valves;

a plurality of heating regions in which the plurality of first valves are heated;

a plurality of heat equalizing structures provided on the base structure at the plurality of heating regions;

a plurality of adjustment structures provided on the base structure, interposed between the plurality of heat equalizing structures so as to fill a gap between each adjacent pair among the plurality of heat equalizing structures and configured to adjust a heat conduction between each adjacent pair among the plurality of heat equalizing structures;

a plurality of body structures provided on the plurality of heat equalizing structures wherein the one or more flow paths are formed therein; and a plurality of heaters installed inside the plurality of heat equalizing structures and provided respectively for the plurality of heating regions, wherein the plurality of first valves are located closest to the process chamber among all valves provided in a piping in communication with the process chamber.

2. The gas supply system of claim 1, wherein the plurality of adjustment structures are configured such that a thermal conductivity between each adjacent pair among the plurality of heat equalizing structures varies in a vertical direction.

3. The gas supply system of claim 1, further comprising:

a plurality of block structures in which the base structure, the plurality of heat equalizing structures and the one or more flow paths are arranged sequentially from below; and at least a flange structure provided between the plurality of block structures and the plurality of first valves.

4. The gas supply system of claim 3, wherein one or more openings constituting the one or more flow paths are formed in the plurality of block structures.

5. The gas supply system of claim 3, wherein the base structure is provided in common for the plurality of first valves, and wherein the plurality of heat equalizing structures and the plurality of block structures are provided on the base structure to be adjacent to each other.

6. The gas supply system of claim 1, wherein the plurality of heaters are configured to be capable of individually heating the plurality of heating regions by being installed inside the plurality of heat equalizing structures.

7. The gas supply system of claim 1, further comprising:

a temperature sensor provided adjacent to the one or more flow paths, wherein the plurality of heaters are configured to be capable of heating the plurality of heating regions to respective pre-set temperatures based on a temperature detected by the temperature sensor.

8. The gas supply system of claim 1, wherein the plurality of heaters are configured to be capable of heating the plurality of heating regions to a temperature set in accordance with a type of a gas flowing through the one or more flow paths provided in the plurality of heating regions.

9. The gas supply system of claim 8, wherein the temperature varies depending on the type of the gas flowing through the one or more flow paths provided in the plurality of heating regions.

10. The gas supply system of claim 1, wherein the fluid that contributes to the processing of the substrate comprises at least one of a process gas or a gaseous mixture of the process gas and an inert gas, and wherein the process gas comprises at least one of a source gas, a reactive gas, a modification gas or combinations thereof.

11. The gas supply system of claim 1, wherein a reactant gas or an inert gas is used for the fluid flowing through the plurality of first valves respectively disposed at boundaries between the plurality of heating regions.

12. The gas supply system of claim 11, wherein the plurality of first valves are not provided at such regions located between the plurality of heating regions and between the plurality of adjustment structures.

13. The gas supply system of claim 1, further comprising:

a second valve group constituted only by a plurality of second valves capable of allowing a fluid that does not contribute to the processing of the substrate to be supplied to the process chamber.

14. The gas supply system of claim 13, wherein the fluid that does not contribute to the processing of the substrate comprises an inert gas.

15. A substrate processing apparatus comprising:

a gas supply system comprising:

a plurality of first valves capable of opening and closing one or more flow paths through which one or more fluids that contribute to a processing of a substrate are supplied to a process chamber;

a base structure provided below the plurality of first valves to extend along a horizontal direction of the plurality of first valves;

a plurality of heating regions in which the plurality of first valves are heated;

a plurality of heat equalizing structures provided on the base structure at the plurality of heating regions;

a plurality of adjustment structures provided on the base structure, interposed between the plurality of heat equalizing structures so as to fill a gap between each adjacent pair among the plurality of heat equalizing structures and configured to adjust a heat conduction between each adjacent pair among the plurality of heat equalizing structures;

a plurality of body structures provided on the plurality of heat equalizing structures wherein the one or more flow paths are formed therein; and a plurality of heaters installed inside the plurality of heat equalizing structures and provided respectively for the plurality of heating regions, wherein the plurality of first valves are located closest to the process chamber among all valves provided in a piping in communication with the process chamber.

16. A method of manufacturing a semiconductor device, comprising:

supplying a fluid that contributes to a processing of a substrate to the substrate through a gas supply system, wherein the gas supply system comprises:

a plurality of first valves capable of opening and closing one or more flow paths through which one or more fluids that contribute to a processing of a substrate are supplied to a process chamber;

a base structure provided below the plurality of first valves to extend along a horizontal direction of the plurality of first valves;

a plurality of heating regions in which the plurality of first valves are heated;

a plurality of heat equalizing structures provided on the base structure at the plurality of heating regions;

a plurality of adjustment structures provided on the base structure, interposed between the plurality of heat equalizing structures so as to fill a gap between each adjacent pair among the plurality of heat equalizing structures and configured to adjust a heat conduction between each adjacent pair among the plurality of heat equalizing structures;

a plurality of body structures provided on the plurality of heat equalizing structures wherein the one or more flow paths are formed therein; and a plurality of heaters installed inside the plurality of heat equalizing structures and provided respectively for the plurality of heating regions, wherein the plurality of first valves are located closest to the process chamber among all valves provided in a piping in communication with the process chamber.

17. The gas supply system of claim 1, further comprising:

a third valve group constituted only by a plurality of third valves through which a fluid having a gaseous state at room temperature is supplied.

* * * * *